United States Patent
Tanabe et al.

(10) Patent No.: US 11,713,515 B2
(45) Date of Patent: Aug. 1, 2023

(54) SILICON INGOT, SILICON BLOCK, SILICON SUBSTRATE, METHOD FOR MANUFACTURING SILICON INGOT, AND SOLAR CELL

(71) Applicant: KYOCERA Corporation, Kyoto (JP)

(72) Inventors: Hideyoshi Tanabe, Higashiomi (JP); Hitoshi Matsuo, Omihachiman (JP)

(73) Assignee: KYOCERA CORPORATION, Kyoto (JP)

( * ) Notice: Subject to any disclaimer, the term of this patent is extended or adjusted under 35 U.S.C. 154(b) by 200 days.

(21) Appl. No.: 17/261,175

(22) PCT Filed: Jul. 5, 2019

(86) PCT No.: PCT/JP2019/026800
§ 371 (c)(1),
(2) Date: Jan. 19, 2021

(87) PCT Pub. No.: WO2020/017360
PCT Pub. Date: Jan. 23, 2020

(65) Prior Publication Data
US 2021/0277537 A1 Sep. 9, 2021

(30) Foreign Application Priority Data
Jul. 20, 2018 (JP) .................................. 2018-137000

(51) Int. Cl.
*C30B 29/06* (2006.01)
*C30B 13/34* (2006.01)
(Continued)

(52) U.S. Cl.
CPC .............. *C30B 29/06* (2013.01); *C30B 13/34* (2013.01); *C30B 29/64* (2013.01); *H01L 31/182* (2013.01)

(58) Field of Classification Search
CPC ......... C30B 29/06; C30B 29/64; C30B 13/34; H01L 31/182
See application file for complete search history.

(56) References Cited

U.S. PATENT DOCUMENTS

| | | | |
|---|---|---|---|
| 2013/0095028 A1* | 4/2013 | Lan ......................... | C30B 11/00 65/33.9 |
| 2014/0186631 A1* | 7/2014 | Chou .................. | H01L 31/1804 428/404 |
| 2016/0122897 A1* | 5/2016 | Fortin ..................... | C30B 11/14 125/21 |

FOREIGN PATENT DOCUMENTS

| | | |
|---|---|---|
| CN | 104911691 A | 9/2015 |
| DE | 102012102597 A1 | 9/2013 |

(Continued)

OTHER PUBLICATIONS

Dongli Hu, et al., "Higher quality mono-like cast silicon with induced grain boundaries", Solar Energy Materials & Solar Cells, 140, (2015), Elsevier B.V., pp. 121-125, 5pp.

(Continued)

*Primary Examiner* — Robert M Kunemund
(74) *Attorney, Agent, or Firm* — Hauptman Ham, LLP

(57) ABSTRACT

An ingot includes a first surface, a second surface opposite to the first surface, and a third surface positioned along a first direction and connecting the first surface and the second surface. The ingot includes: a first pseudo single crystal region; an intermediate region containing one or more pseudo single crystal regions; and a second pseudo single crystal region. The first pseudo single crystal region, the intermediate region, and the second pseudo single crystal region are positioned adjacent sequentially in a second direction perpendicular to the first direction. In the second direction, a width of each of the first and second pseudo single crystal regions is larger than a width of the first (Continued)

intermediate region. Each of a boundary between the first pseudo single crystal region and the intermediate region and a boundary between the second pseudo single crystal region and the intermediate region includes a coincidence boundary.

12 Claims, 18 Drawing Sheets

(51) Int. Cl.
  *C30B 29/64* (2006.01)
  *H01L 31/18* (2006.01)

(56) References Cited

FOREIGN PATENT DOCUMENTS

| EP | 2016046213 | * | 3/2016 |
| JP | 2014162699 A | | 9/2014 |

OTHER PUBLICATIONS

Trempa, Matthias et al., Influence of grain boundaries intentionally induced between seed plates on the defect generation in quasi-mono-crystalline silicon ingots, Crystal Research & Technology 50, No. 1, Aug. 20, 2014, pp. 124-132, 10pp.

* cited by examiner

FIG. 5
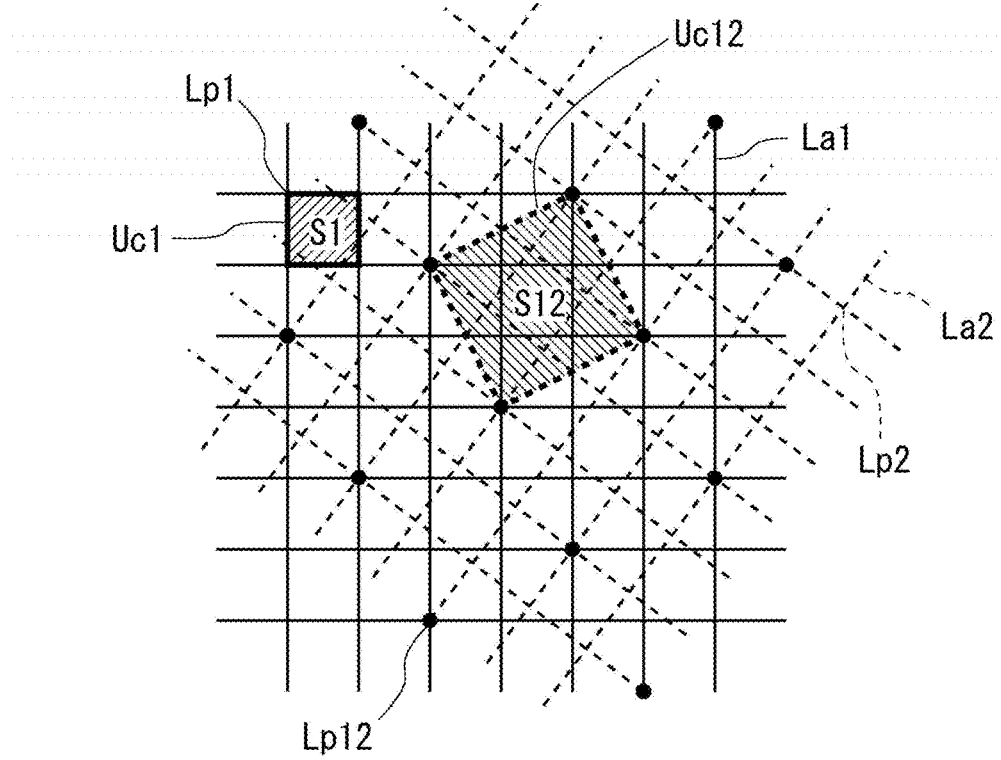
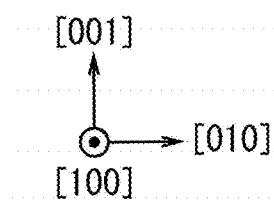

XIb-XIb

SILICON INGOT, SILICON BLOCK, SILICON SUBSTRATE, METHOD FOR MANUFACTURING SILICON INGOT, AND SOLAR CELL

CROSS-REFERENCE TO RELATED APPLICATION

The present application is a National Phase entry based on PCT Application No. PCT/JP2019/026800 filed on Jul. 5, 2019, entitled "SILICON INGOT, SILICON BLOCK, SILICON SUBSTRATE, METHOD FOR PRODUCING SILICON INGOT, AND SOLAR CELL", which claims the benefit of Japanese Patent Application No. 2018-137000, filed on Jul. 20, 2018, entitled "SILICON INGOT, SILICON BLOCK, SILICON SUBSTRATE, METHOD FOR PRODUCING SILICON INGOT, AND SOLAR CELL".

The contents of which are incorporated by reference herein in their entirety.

FIELD

Embodiments of the present disclosure relate generally to a silicon ingot, a silicon block, a silicon substrate, a method for manufacturing a silicon ingot, and a solar cell.

BACKGROUND

A solar cell using a polycrystalline silicon substrate (also referred to as a polycrystalline silicon solar cell) has a relatively high conversion efficiency and is easy to mass-produce.

The polycrystalline silicon substrate used in this polycrystalline silicon solar cell is obtained by manufacturing a silicon ingot generally using the cast growth method, cutting out a silicon block from the ingot, and further slicing the block with a wire saw apparatus or the like. The cast growth method is a method in which a bulk of polycrystalline silicon is grown in a mold from the bottom surface portion of the mold upward using a silicon melt.

By the way, in recent years, a mono-like casting method has been developed as a kind of the cast growth method. According to this mono-like casting method, using a silicon melt to grow crystal grains upward starting from a seed crystal arranged on the bottom surface portion of the mold makes it possible to form a pseudo single crystal (also referred to as a pseudo single crystal) silicon that inherits the crystal orientation of the seed crystal. Then, for example, if this pseudo single crystal silicon substrate is applied to a solar battery, it is expected that the conversion efficiency will be improved as compared with the polycrystalline silicon solar cell.

SUMMARY

A silicon ingot, a silicon block, a silicon substrate, a method for manufacturing a silicon ingot, and a solar cell are disclosed.

In one embodiment, a silicon ingot includes a first surface, a second surface positioned on an opposite side of the first surface, and a third surface positioned along a first direction in a state of connecting the first surface and the second surface. The ingot includes: a first pseudo single crystal region; a first intermediate region containing one or more pseudo single crystal regions; and a second pseudo single crystal region. The first pseudo single crystal region, the first intermediate region, and the second pseudo single crystal region are positioned adjacent sequentially in a second direction perpendicular to the first direction. In the second direction, each of a first width of the first pseudo single crystal region and a second width of the second pseudo single crystal region is larger than a third width of the first intermediate region. Each of a boundary between the first pseudo single crystal region and the first intermediate region and a boundary between the second pseudo single crystal region and the first intermediate region includes a coincidence boundary.

In one embodiment, a silicon block includes a fourth surface, a fifth surface positioned on an opposite side of the fourth surface, and a sixth surface positioned along a first direction in a state of connecting the fourth surface and the fifth surface. The block includes a third pseudo single crystal region; a second intermediate region containing one or more pseudo single crystal regions; and a fourth pseudo single crystal region. The third pseudo single crystal region, the second intermediate region, and the fourth pseudo single crystal region are positioned adjacent sequentially in a second direction perpendicular to the first direction. In the second direction, each of a fourth width of the third pseudo single crystal region and a fifth width of the fourth pseudo single crystal region is larger than a sixth width of the second intermediate region. Each of a boundary between the third pseudo single crystal region and the second intermediate region and a boundary between the fourth pseudo single crystal region and the second intermediate region includes a coincidence boundary.

In one embodiment, a silicon substrate is a silicon substrate with a flat plate shape including a seventh surface, an eighth surface positioned on a back side of the seventh surface in a first direction, and an outer peripheral surface positioned in a state of connecting the seventh surface and the eighth surface. The silicon substrate includes: a fifth pseudo single crystal region; a third intermediate region containing one or more pseudo single crystal regions; and a sixth pseudo single crystal region. The fifth pseudo single crystal region, the third intermediate region, and the sixth pseudo single crystal region are positioned adjacent sequentially in a second direction perpendicular to the first direction. In the second direction, each of a seventh width of the fifth pseudo single crystal region and an eighth width of the sixth pseudo single crystal region is larger than a ninth width of the third intermediate region. Each of a boundary between the fifth pseudo single crystal region and the third intermediate region and a boundary between the sixth pseudo single crystal region and the third intermediate region includes a coincidence boundary.

In one embodiment, a method for manufacturing a silicon ingot includes a first step, a second step, a third step, and a fourth step. The first step includes preparing a mold having an opening that opens in a first direction. The second step includes arranging a first seed crystal portion of single crystal silicon, an intermediate seed crystal portion including one or more pieces of single crystal silicon and having a width in a second direction perpendicular to the first direction smaller than that of the first seed crystal portion, and a second seed crystal portion of single crystal silicon having a width in the second direction larger than that of the intermediate seed crystal portion so that the first seed crystal portion, the intermediate seed crystal portion, and the second seed crystal portion are adjacent sequentially in the second direction on a bottom surface portion in the mold. The third step includes pouring silicon melt into the mold in a state where a temperature of the first seed crystal portion, the intermediate seed crystal portion, and the second seed crystal portion are raised to near a melting point of silicon. The fourth step includes causing the silicon melt to perform unidirectional solidification upward from the bottom surface portion side of the mold. The second step includes arranging the first seed crystal portion and the intermediate seed crystal portion so that a first rotation angle relationship about a virtual axis along the first direction of single crystal silicon between the first seed crystal portion and the intermediate seed crystal portion is a rotation angle relationship of single crystal silicon corresponding to a coincidence boundary. The second step includes arranging the second seed crystal portion and the intermediate seed crystal portion so that a second rotation angle relationship about a virtual axis along the first direction of single crystal silicon between the second seed crystal portion and the intermediate seed crystal portion is a rotation angle relationship of single crystal silicon corresponding to a coincidence boundary.

In one embodiment, a solar cell includes the above-described silicon substrate; and an electrode positioned on the silicon substrate.

BRIEF DESCRIPTION OF THE DRAWINGS

FIG. 5 illustrates a diagram for illustrating a Σ value.

DETAILED DESCRIPTION

Figure 1:
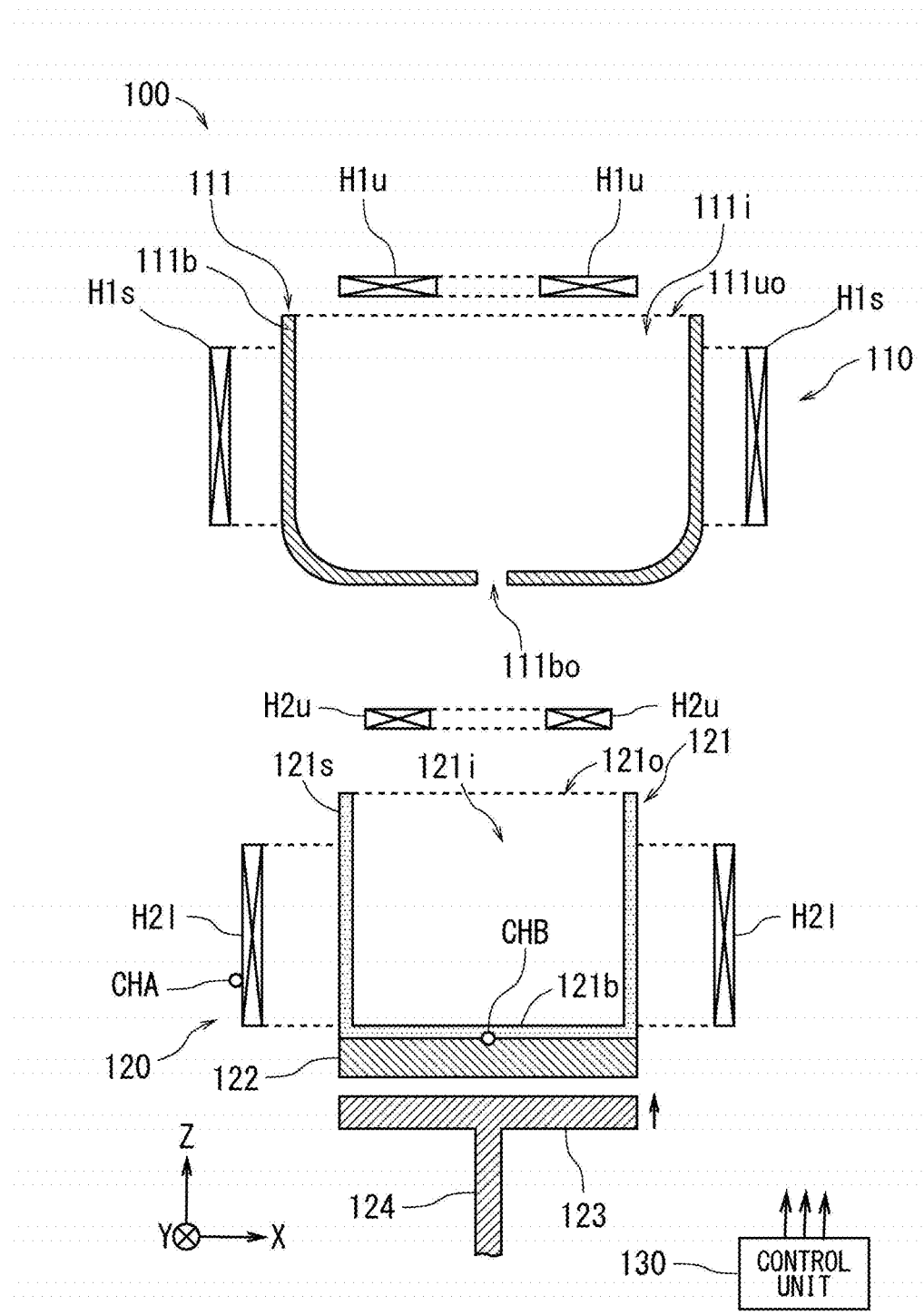
FIG. 1 illustrates a diagram showing an example of a virtual cutting plane portion of a silicon ingot manufacturing apparatus.

A solar cell using a polycrystalline silicon substrate (polycrystalline silicon solar cell) has a relatively high conversion efficiency and is suitable for mass production. In addition, silicon is obtained, for example, from silicon oxide existing in large quantity on earth. Furthermore, a polycrystalline silicon substrate can be obtained relatively easily, for example, by slicing a block of silicon cut out from a silicon ingot obtained by a casting method. For this reason, polycrystalline silicon solar cells have continued to occupy a high share of the total solar cell production for many years.

By the way, in order to improve the conversion efficiency of a solar cell, it is considered that it is more advantageous to use a single crystal silicon substrate than a polycrystalline silicon substrate.

Therefore, it is considered to manufacture a silicon ingot including a region of pseudo single crystal by a mono-like casting method in which a silicon melt is used and crystal grains are grown upward starting from a seed crystal arranged on the bottom surface portion of a mold. The pseudo single crystal is formed by inheriting the crystal orientation of the seed crystal and growing in one direction. In this pseudo single crystal, for example, a certain number of dislocations may be present or grain boundaries may be present.

In the mono-like casting method, for example, as in the general casting method, when a silicon ingot is manufactured, distortions and defects are likely to occur from the side wall in the mold as a base point, and the outer peripheral portion of the silicon ingot is likely to include many defects. Therefore, for example, it is conceivable to obtain a high-quality silicon substrate with few defects by cutting off the outer peripheral portion of the silicon ingot to form a silicon block and then slicing the silicon block. Here, for example, by increasing the size of the silicon ingot so that the areas of the bottom surface and the upper surface are large, it is possible to reduce the proportion of the outer peripheral portion cut off in the silicon ingot. As a result, for example, the productivity of silicon ingots can be improved.

However, for example, it is not easy to increase the size of the seed crystal for being arranged on the bottom surface portion of the mold. Therefore, in order to increase the size of the silicon ingot, it is considered to arrange two or more seed crystals on the bottom surface portion of the mold and then to grow a silicon pseudo single crystal from the bottom surface portion side of the mold upward using a silicon melt in the mold.

However, for example, many defects may occur in the portion of the silicon pseudo single crystal grown upward from, as base points, a place where two or more seed crystals are adjacent to each other and a portion near the place. This may result in quality degradation due to increased defects in silicon ingots, silicon blocks, and silicon substrates.

Thus, the present inventors have created a technique capable of improving the quality of silicon ingots, silicon blocks, silicon substrates, and solar cells by reducing defects.

Regarding this, hereinafter, one embodiment will be described with reference to the drawings. In the drawings, parts having similar configurations and functions are denoted by the same reference numerals, and overlapping description will be omitted in the following description. The drawings are shown schematically. A right-handed XYZ coordinate system is given to each of FIGS. 1, 3 to 4B, and 7 to 18. In this XYZ coordinate system, a height direction of the mold, the silicon ingot, and the silicon block, and a thickness direction of the silicon substrate are a +Z directions. In addition, in this XYZ coordinate system, a width direction of each of the mold, the silicon ingot, the silicon block, and the silicon substrate is assumed as a +X direction, and a direction orthogonal to both the +X direction and the +Z direction is assumed as a +Y direction.

1. One Embodiment 1-1. Manufacturing Apparatus for Silicon Ingot

A manufacturing apparatus 100 for a silicon ingot In1 (see FIGS. 10A and 10B) according to one embodiment will be described with reference to FIG. 1. The manufacturing apparatus 100 is an apparatus for manufacturing a silicon ingot In1 including a pseudo single crystal region by a mono-like casting method of growing crystal grains starting from a seed crystal arranged on the bottom portion 121b of the mold 121.

As shown in FIG. 1, the manufacturing apparatus 100 includes, for example, an upper portion unit 110, a lower portion unit 120, and a control unit 130.

The upper portion unit 110 includes, for example, a crucible 111, a first upper portion heater H1u, and a side portion heater H1s. The lower portion unit 120 includes a mold 121, a mold holding portion 122, a cooling plate 123, a rotating shaft 124, a second upper portion heater H2u, a lower portion heater H2l, a first temperature measuring unit CHA, and a second temperature measuring unit CHB, for example. As the material of the crucible 111 and the mold 121, for example, a material in which melting, deformation, decomposition, and reaction with silicon are unlikely to occur at a temperature not lower than the melting point of silicon and the content of impurities is reduced is applied.

The crucible 111 includes, for example, a main body portion 111b. The main body portion 111b has a substantially cylinder-shaped structure with a bottom as a whole. Here, the crucible 111 has, for example, a first internal space 111i and a first upper portion opening 111uo. The first internal space 111i is a space in a state of being surrounded by the main body portion 111b. The first upper portion opening 111uo is a portion in a state where the first internal space 111i is open so as to connect to the upper space outside the crucible 111. In addition, the main body portion 111b includes a lower portion opening 111bo positioned in a state of penetrating the bottom portion of the main body portion 111b. Quartz glass or the like is applied as the material of the main body portion 111b, for example. The first upper portion heater H1u is positioned in an annular shape in a plan view directly above the first upper portion opening 111uo, for example. The side portion heater H1s is positioned in an annular shape in a plan view so as to surround the main body portion 111b from the side, for example.

For example, when the silicon ingot In1 is manufactured, in the upper portion unit 110, a plurality of solid silicon lumps being the raw materials of the silicon ingot In1 are filled into the first internal space 111i of the crucible 111 from the first upper portion opening 111uo. This silicon lump may contain silicon in a powder state (also referred to as silicon powder). The silicon lump filled into the first internal space 111i is melted by heating by the first upper portion heater H1u and the side portion heater H1s. Then, for example, melting the silicon lumps provided on the lower portion opening 111bo by heating causes the molten silicon (also referred to as silicon melt) MS1 (see FIG. 8) in the first interior space 111i to be poured toward the mold 121 of the lower portion unit 120 through the lower portion opening 111bo. Here, in the upper portion unit 110, not providing the lower portion opening 111bo in the crucible 111 and tilting the crucible 111 allows the silicon melt MS1 to be poured from the inside of the crucible 111 into the mold 121, for example.

The mold 121 has a pipe-shaped structure with a bottom as a whole. The mold 121 includes, for example, a bottom portion 121b and a sidewall portion 121s. Here, the mold 121 has, for example, a second internal space 121i and a second upper portion opening 121o. The second internal space 121i is a space in a state of being surrounded by the bottom portion 121b and the sidewall portion 121s. The second upper portion opening 121o is a portion in a state where the second internal space 121i is open so as to connect to the upper space outside the mold 121. In other words, the second upper portion opening 121o is in a state of opening in the +Z direction as the first direction. In one embodiment, the second upper portion opening 121o is positioned at an end portion in the +Z direction of the mold 121. A square shape is applied as the shapes of the bottom portion 121b and the second upper portion opening 121o, for example. One side of the bottom portion 121b and the second upper portion opening 121o is, for example, about 300 mm to 800 mm. The second upper portion opening 121o can receive the pouring of the silicone melt MS1 from the crucible 111 into the second interior space 121i. Here, for example, silica is applied as the material of the sidewall portion 121s and the bottom portion 121b. Furthermore, the sidewall portion 121s may be formed by combining, for example, a carbon fiber reinforced carbon composite material and felt as a heat insulating material.

In addition, as shown in FIG. 1, the second upper portion heater H2u is positioned in an annular shape directly above the second upper portion opening 121o of the mold 121, for example. A circular ring shape, a triangular ring shape, a square ring shape, a polygonal ring shape, or the like is applied as the annular shape. The lower portion heater H2l is positioned, for example, in an annular shape so as to surround, from the side, the portion from the lower portion to the upper portion in the +Z direction of the sidewall portion 121s of the mold 121. The lower portion heater H2l may be divided into a plurality of regions, and the temperature of each region may be controlled independently.

The mold holding portion 122 is positioned so as to be in close contact with the lower surface of the bottom portion 121b of the mold 121 in a state of holding the mold 121 from below, for example. A material having high heat transfer performance such as graphite is applied as the material of the mold holding portion 122. Here, a heat insulating portion may be positioned between the mold holding portion 122 and the sidewall portion 121s of the mold 121, for example. In this case, for example, heat can be preferentially transmitted from the bottom portion 121b rather than the sidewall portion 121s to the cooling plate 123 via the mold holding portion 122. A heat insulating material such as felt is applied as the material of the heat insulating portion, for example.

The cooling plate 123 can be raised or lowered by the rotation of the rotating shaft 124, for example. For example, by being raised due to the rotation of the rotating shaft 124, the cooling plate 123 can come into contact with the lower surface of the mold holding portion 122. In addition, for example, by being lowered due to the rotation of the rotating shaft 124, the cooling plate 123 can be separated from the lower surface of the mold holding portion 122. That is, the cooling plate 123 is positioned to be attachable to and detachable from the lower surface of the mold holding portion 122, for example. Here, the contact of the cooling plate 123 with the lower surface of the mold holding portion 122 is also referred to as "grounding". As the cooling plate 123, for example, a hollow metal plate or the like having a structure inside in which water or gas circulates is applied. When the silicon ingot In1 is manufactured, bringing the cooling plate 123 into contact with the lower surface of the mold holding portion 122 in a state where the silicon melt MS1 is filled into the second internal space 121i of the mold 121 allows the heat of the silicon melt MS1 to be removed. At this time, the heat of the silicon melt MS1 is transferred to the cooling plate 123 via the bottom portion 121b of the mold 121 and the mold holding portion 122. Thus, for example, the silicon melt MS1 is cooled from the bottom portion 121b side by the cooling plate 123.

The first temperature measuring unit CHA and the second temperature measuring unit CHB can measure the temperature, for example. However, the second temperature measuring unit CHB may not be provided. The first temperature measuring unit CHA and the second temperature measuring unit CHB can measure the temperature by, for example, a thermocouple coated with a thin tube made of alumina or carbon. Then, for example, in the temperature detection unit included in the control unit 130 or the like, the temperature corresponding to the voltage generated in each of the first temperature measuring unit CHA and the second temperature measuring unit CHB is detected. Here, the first temperature measuring unit CHA is positioned near the lower portion heater H2l. The second temperature measuring unit CHB is positioned near the lower surface of the central portion of the bottom portion 121b of the mold 121.

The control unit 130 can control the entire operation in the manufacturing apparatus 100, for example. The control unit 130 includes a processor, a memory, a storage unit, and the like, for example. The control unit 130 can perform various controls by executing a program stored in the storage unit by a processor, for example. For example, the control unit 130 controls the thermal outputs of the first upper portion heater H1u, the second upper portion heater H2u, the side portion heater H1s, and the lower portion heater H2l. The control unit 130 can control the thermal outputs of the first upper portion heater H1u, the second upper portion heater H2u, the side portion heater H1s, and the lower portion heater H2l according to at least one of the passage of time and the temperature obtained using the first temperature measuring unit CHA and the second temperature measuring unit CHB, for example.

1-2. Manufacturing Method of Silicon Ingot

Figure 2:
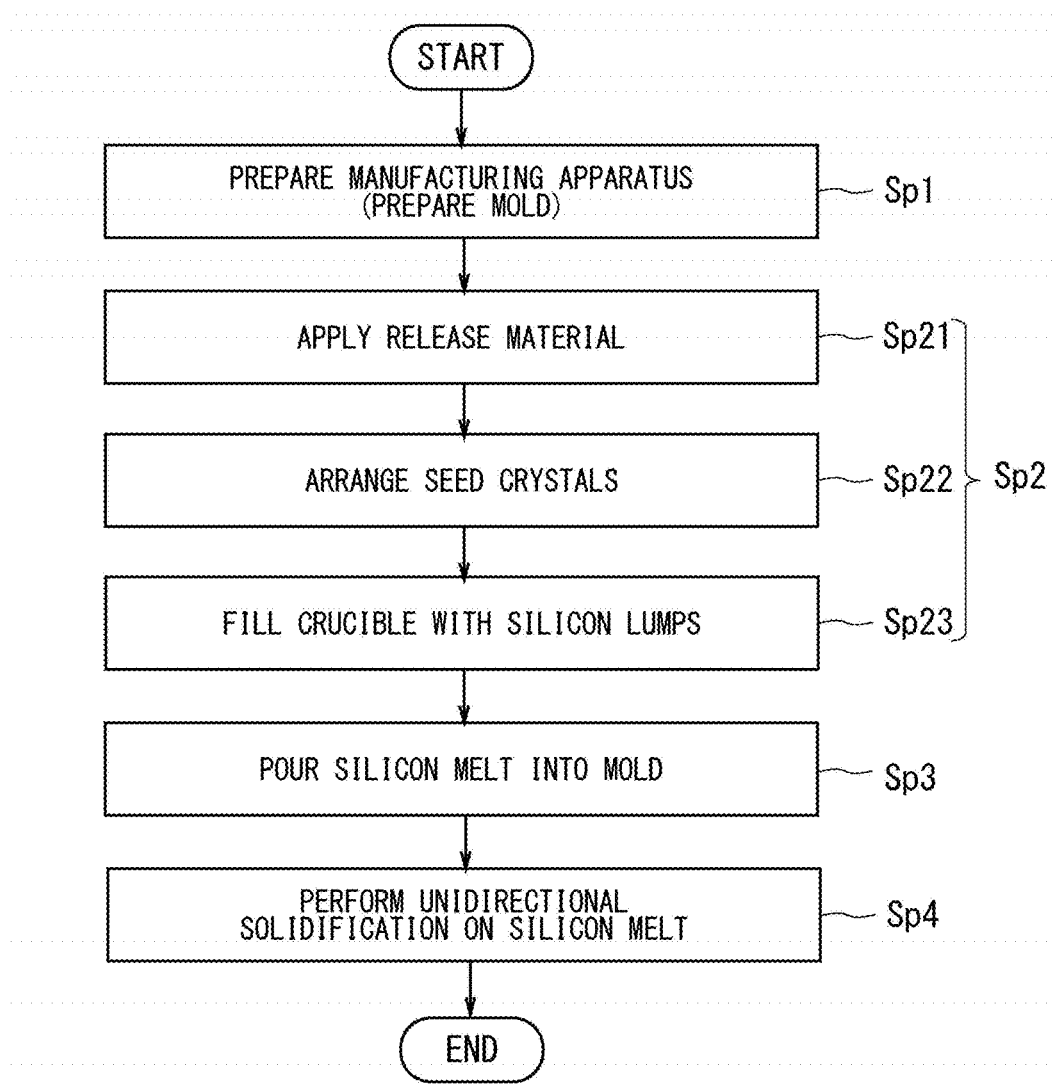
FIG. 2 illustrates a flowchart showing an example of silicon ingot manufacturing steps.

A method for manufacturing the silicon ingot In1 using the manufacturing apparatus 100 according to one embodiment will be described with reference to FIGS. 2 to 9. As shown in FIG. 2, for example, in the method for manufacturing the silicon ingot In1 according to one embodiment, a first step of step Sp1, a second step of step Sp2, a third step of step Sp3, and a fourth step of step Sp4 are performed in the order of this description. Thus, a high-quality silicon ingot In1 uniform in crystal orientation can be easily manufactured. FIGS. 3 to 4B, and 7 to 9 show, in each step, the states of both the crucible 111 and the mold 121 or the state of the mold 121.

1-2-1. First Step

In the first step of step Sp1, the manufacturing apparatus 100 described above is prepared. The manufacturing apparatus 100 includes, for example, a mold 121 having a second upper portion opening 121o that opens in the +Z direction as the first direction.

1-2-2. Second Step

In the second step of step Sp2, for example, the seed crystal portion group 200s of single crystal silicon is arranged on the bottom surface portion in the mold 121 prepared in the first step. In one embodiment, in the second step, the three steps of step Sp21, step Sp22, and step Sp23 are performed in the order of this description.

Figure 3:
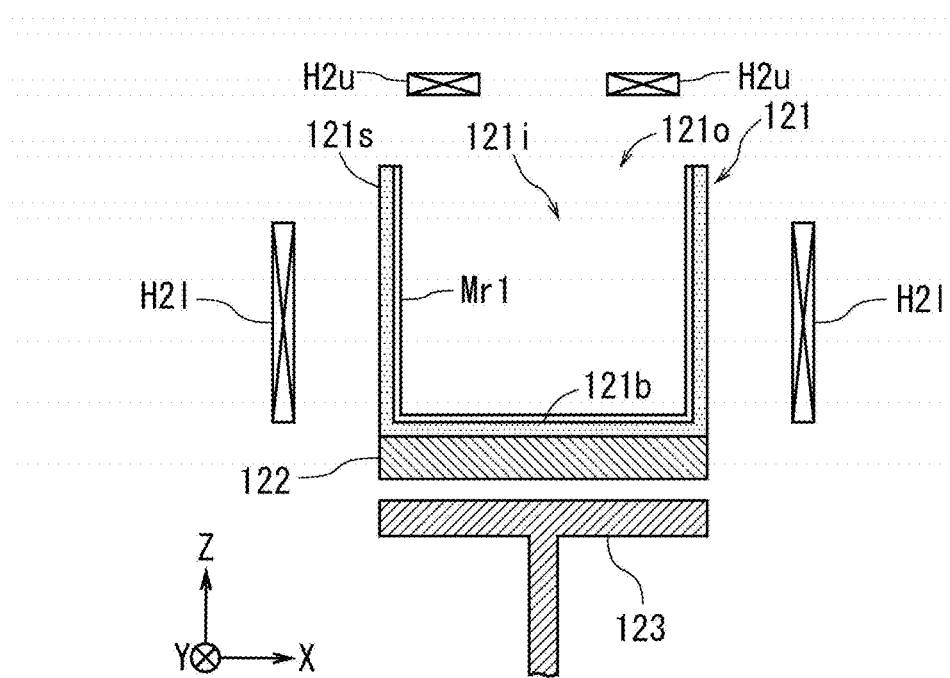
FIG. 3 illustrates a diagram showing an example of a virtual cutting plane portion of a mold and its surroundings in a state where a release material is applied to an inner wall of the mold.

In step Sp21, for example, as shown in FIG. 3, a release material layer Mr1 is formed on the inner wall surface of the mold 121 by applying a release material. Due to the presence of the release material layer Mr1, for example, when the silicon melt MS1 solidifies in the mold 121, the silicon ingot In1 is less likely to fuse to the inner wall surface of the mold 121. As the material of the release material layer Mr1, for example, among silicon nitride, silicon carbide, silicon oxide, and the like, one or more types of materials are applied. The release material layer Mr1 can be formed, for example, by coating slurry containing one or more materials of silicon nitride, silicon carbide, and silicon oxide on the inner wall surface of the mold 121 by application or spraying. The slurry is produced by stirring the solution produced by adding powder of one material among silicon nitride, silicon carbide, and silicon oxide or a mixture of two or more materials into a solution mainly containing an organic binder such as polyvinyl alcohol (PVA) and a solvent, for example.

Figure 4A:
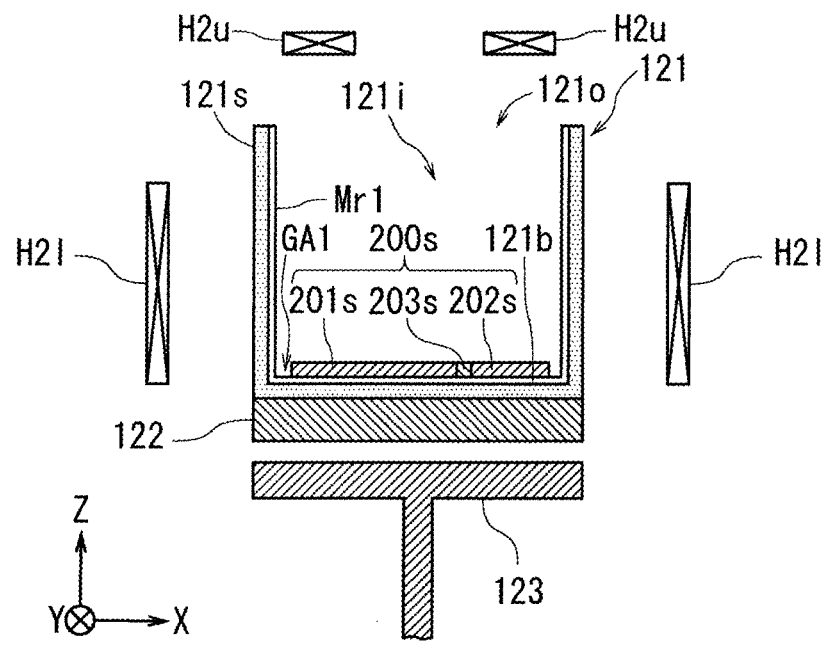
FIG. 4A illustrates a diagram showing an example of a virtual cutting plane portion of the mold and its surroundings in a state where a seed crystal is arranged at a bottom portion of the mold.
Figure 4B:
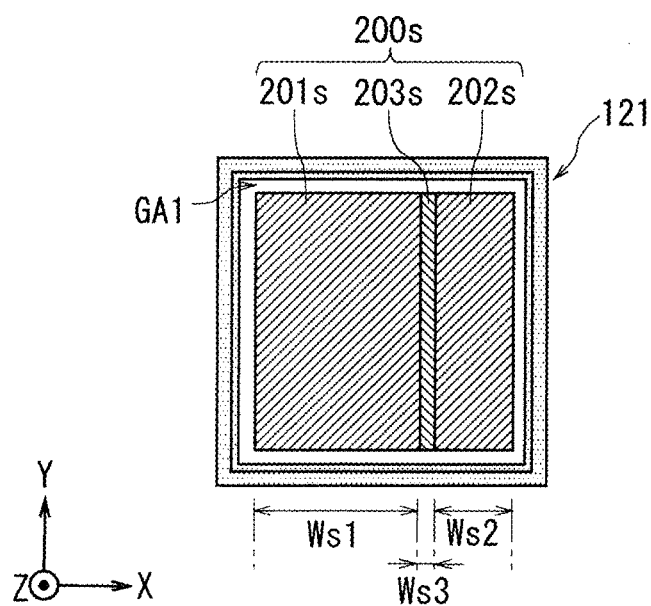
FIG. 4B illustrates a plan view showing an example of the mold in a state where the seed crystal is arranged at the bottom portion of the mold.

In step Sp22, as shown in FIGS. 4A and 4B, the seed crystal portion group 200s is arranged on the inner wall surface of the bottom portion 121b as the bottom surface portion in the mold 121. At this time, for example, when the release material layer Mr1 formed on the inner wall surface of the mold 121 in step Sp21 is dried, the seed crystal portion group 200s may be attached to the release material layer Mr1.

Here, for example, if the plane orientation of each upper surface positioned in a state of orienting in the +Z direction as the first direction of the seed crystal portion group 200s is (100) in the Miller index, the seed crystal portion group 200s can be easily manufactured. In addition, for example, the crystal growth rate when unidirectional solidification of the silicon melt MS1 described below is to be performed can be improved. In addition, the shape of the upper surface of the seed crystal portion group 200s is, for example, rectangular or square when viewed in a plan view as shown in FIG. 4B. In addition, the thickness of the seed crystal portion group 200s is a thickness to such a degree that the seed crystal portion group 200s does not melt to the bottom portion 121b when the silicon melt MS1 is poured into the mold 121 from the crucible 111. Specifically, the thickness of the seed crystal portion group 200s is, for example, about 10 mm to 40 mm In one embodiment, for example, in consideration of improvement in casting efficiency due to increase in the bottom area of the silicon ingot In1 and difficulty in increasing the size of the seed crystal, a seed crystal portion group 200s including a plurality of seed crystals is arranged on the inner wall surface of the bottom portion 121b. Specifically, for example, the seed crystal portion group 200s includes the first seed crystal portion 201s, the second seed crystal portion 202s, and the intermediate seed crystal portion 203s. Here, for example, on the inner wall surface of the bottom portion 121b, the first seed crystal portion 201s, the intermediate seed crystal portion 203s, and the second seed crystal portion 202s are arranged, in the +X direction as the second direction perpendicular to the +Z direction as the first direction, so as to be adjacent in the order of this description. In other words, the intermediate seed crystal portion 203s is arranged between the first seed crystal portion 201s and the second seed crystal portion 202s.

Each of the first seed crystal portion 201s and the second seed crystal portion 202s is made of single crystal silicon. The intermediate seed crystal portion 203s includes one or more pieces of single crystal silicon. In addition, each of the first seed crystal portion 201s, the second seed crystal portion 202s, and the intermediate seed crystal portion 203s has a rectangular outer shape when viewed in a plan view in the −Z direction, for example. However, this outer shape is not limited to a rectangular shape. Then, in the +X direction as the second direction, the width of the intermediate seed crystal portion 203s (also referred to as third seed width) Ws3 is smaller than the width of the first seed crystal portion 201s (also referred to as first seed width) Ws1 and the width of the second seed crystal portion 202s (also referred to as second seed width) Ws2. In other words, in the +X direction as the second direction, each of the first seed width Ws1 of the first seed crystal portion 201s and the second seed width Ws2 of the second seed crystal portion 202s is larger than the third seed width Ws3 of the intermediate seed crystal portion 203s. Here, for example, it is assumed that the inner wall surface of the bottom portion 121b has a rectangular shape or a square shape having a side length of about 350 mm. In this case, for example, the first seed width Ws1 of the first seed crystal portion 201s and the second seed width Ws2 of the second seed crystal portion 202s are assumed to be about 50 mm to 250 mm, and the third seed width Ws3 of the intermediate seed crystal portion 203s is assumed to be about 5 mm to 20 mm.

Here, as each of the first seed crystal portion 201s and the second seed crystal portion 202s, plate-shaped or block-shaped single crystal silicon is applied, for example. As the intermediate seed crystal portion 203s, one or more pieces of rod-shaped single crystal silicon are applied, for example. In other words, as each of the first seed crystal portion 201s, the second seed crystal portion 202s, and the intermediate seed crystal portion 203s, single crystal silicon of the same material is applied, for example. Here, the intermediate seed crystal portion 203s has a longitudinal direction along the +Y direction as the third direction orthogonal to both the +Z direction as the first direction and the +X direction as the second direction, for example. The intermediate seed crystal portion 203s may be one single crystal silicon, may include two or more pieces of single crystal silicon positioned side by side in the +Y direction as the third direction, or may include two or more pieces of single crystal silicon positioned side by side in the +X direction as the second direction, for example.

Here, for example, the angular relationship in the rotation direction of the single crystal silicon about a virtual axis along the +Z direction as the first direction between the first seed crystal portion 201s and the intermediate seed crystal portion 203s is assumed as the first rotation angle relationship. In addition, for example, the rotation angle relationship of the single crystal silicon about a virtual axis along the +Z direction as the first direction between the intermediate seed crystal portion 203s and the second seed crystal portion 202s is assumed as the second rotation angle relationship. In this case, in step Sp22, the first seed crystal portion 201s and the intermediate seed crystal portion 203s are arranged so that the first rotation angle relationship is the rotation angle relationship of the single crystal silicon corresponding to the coincidence boundary, for example. The "coincidence boundary" refers to a grain boundary at which when two crystal grains, having the same crystal lattice, adjacent to each other across the grain boundary have a relatively rotated relationship with a common crystal orientation as the rotation axis, the positions of the crystal lattices common to these two crystal grains form lattice points regularly arranged. When two crystal grains adjacent to each other across the coincidence boundary are the first crystal grain and the second crystal grain, if the crystal lattice of the first crystal grain is common to the lattice points of the crystal lattice of the second crystal grain for every N lattice points at the coincidence boundary, N indicating the appearance cycle of this lattice point is referred to as a "Σ value" of the coincidence boundary.

This "Σ value" will be described with a simple cubic lattice as an example. In FIG. 5, the positions of the lattice points Lp1 on the (100) plane of the Miller index of the simple cubic lattice are shown by the intersections of a plurality of vertical lines and a plurality of horizontal lines orthogonal to each other drawn by the solid line La1. In the example in FIG. 5, the unit cell of the simple cubic lattice (also referred to as first unit cell) Uc1 is a square part surrounded by thick solid lines. In FIG. 5, the positions of the lattice points Lp2 on the (100) plane of the Miller index of the simple cubic lattice after rotating the simple cubic lattice clockwise 36.52 degrees with the crystal axis along the [100] orientation in the Miller index as the rotation axis are indicated by the intersections of a plurality of straight lines orthogonal to each other drawn by the broken lines La2. Here, a point where the lattice point Lp1 before rotation and the lattice point Lp2 after rotation overlap (also referred to as corresponding lattice point) Lp12 is cyclically generated. In FIG. 5, black circles are denoted at the positions of a plurality of cyclical corresponding lattice points Lp12. In the example in FIG. 5, the unit cell (also referred to as corresponding unit cell) Uc12 in the lattice (also referred to as corresponding lattice) including a plurality of corresponding lattice points Lp12 is a square part surrounded by thick broken lines. Here, a Σ value is used as an index indicating the degree of correspondence (density of corresponding lattice points) between the simple cubic lattice before rotation, whose position of the lattice point Lp1 is shown with the intersection of the solid lines La1 (also referred to as the first lattice), and the simple cubic lattice after rotation, whose position of the lattice point Lp2 is shown with the intersection of the broken lines La2 (also referred to as the second lattice). Here, the Σ value can be calculated, for example, by dividing an area S12 of the corresponding unit cell Uc12 by an area S1 of the first unit cell Uc1, shown in FIG. 5. Specifically, the Σ value can be calculated by the formula of Σ value=(area of corresponding unit cell)/(area of first unit cell)=(S12)/(S1). In the example in FIG. 5, the calculated Σ value is 5. The Σ value calculated in this way can be used as an index showing the degree of correspondence between the first lattice and the second lattice adjacent to each other across the grain boundary and having a predetermined rotation angle relationship. That is, the Σ value can be used as an index indicating the degree of correspondence between two crystal grains adjacent to each other across the grain boundary and having a predetermined rotation angle relationship and the same crystal lattice.

In addition, the intermediate seed crystal portion 203s and the second seed crystal portion 202s are arranged so that the second rotation angle relationship is the rotation angle relationship of the single crystal silicon corresponding to the coincidence boundary, for example. Here, an error of about one degree to several degrees or less can be tolerated in the rotation angle relationship of the single crystal silicon corresponding to the coincidence boundary. This error includes, for example, a cutting error in preparing the first seed crystal portion 201s, the second seed crystal portion 202s, and the intermediate seed crystal portion 203s, an error in arranging the first seed crystal portion 201s, the second seed crystal portion 202s, and the intermediate seed crystal portion 203s, and the like. This error can be alleviated, for example, when unidirectional solidification of the silicon melt MS1 described below is performed.

Here, for example, it is assumed that the plane orientation of each upper surface positioned in a state of orienting in the +Z direction as the first direction of the first seed crystal portion 201s, the intermediate seed crystal portion 203s, and the second seed crystal portion 202s is (100) in the Miller index. From another point of view, for example it is assumed that the crystal orientation along the +Z direction as the first direction in each of the first seed crystal portion 201s, the intermediate seed crystal portion 203s, and the second seed crystal portion 202s is <100> in the Miller index. In this case, as the coincidence boundary, a coincidence boundary is applied among any one of, for example, a coincidence boundary with a Σ value of 5, a coincidence boundary with a Σ value of 13, a coincidence boundary with a Σ value of 17, a coincidence boundary with a Σ value of 25, and a coincidence boundary with a Σ value of 29. The rotation angle relationship of the single crystal silicon corresponding to the coincidence boundary with a Σ value of 5 is, for example, about 36° to 37°, and may be about 35° to 38°. The rotation angle relationship of the single crystal silicon corresponding to the coincidence boundary with a Σ value of 13 is, for example, about 22° to 23°, and may be about 21° to 24°. The rotation angle relationship of the single crystal silicon corresponding to the coincidence boundary with a Σ value of 17 is, for example, about 26° to 27°, and may be about 25° to 28°. The rotation angle relationship of the single crystal silicon corresponding to the coincidence boundary with a Σ value of 25 is, for example, about 16° to 17°, and may be about 15° to 18°. The rotation angle relationship of the single crystal silicon corresponding to the coincidence boundary (also referred to as random grain boundary) with a Σ value of 29 is, for example, about 43° to 44°, and may be about 42° to 45°. Here, each crystal orientation of the first seed crystal portion 201s, the intermediate seed crystal portion 203s, and the second seed crystal portion 202s can be checked by the measurement using an X-ray diffraction method, an electron backscatter diffraction (EBSD) method, or the like.

Here, the first seed crystal portion 201s, the second seed crystal portion 202s, and the intermediate seed crystal portion 203s are arranged so that the upper surface having the plane orientation of (100) in the Miller index of the silicon crystal is positioned in a state of orienting in the +Z direction as the first direction, for example. In this case, for example, the crystal growth rate when unidirectional solidification of the silicon melt MS1 described below is to be performed can be improved. Thus, for example, a pseudo single crystal formed by growing crystal grains upward starting from each of the first seed crystal portion 201s, the second seed crystal portion 202s, and the intermediate seed crystal portion 203s can be easily obtained. As a result, the quality of the silicon ingot In1 can be easily improved.

Figure 6A:
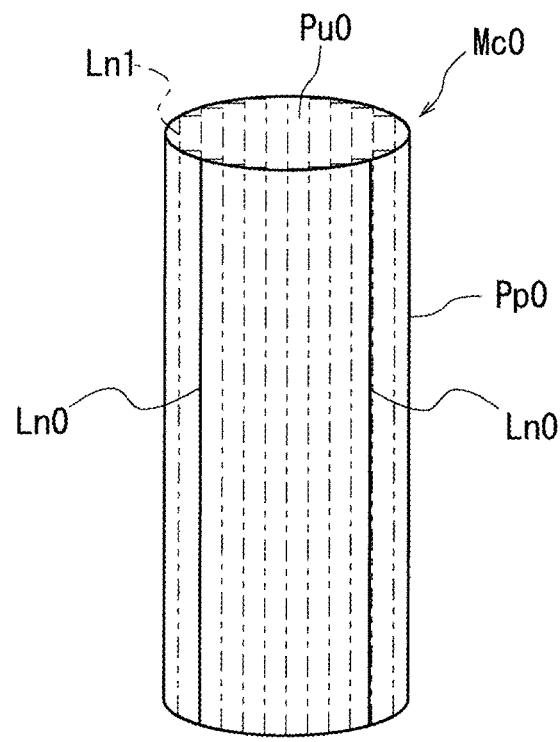
FIG. 6A illustrates a diagram showing an example of a method for preparing a seed crystal.
Figure 6B:
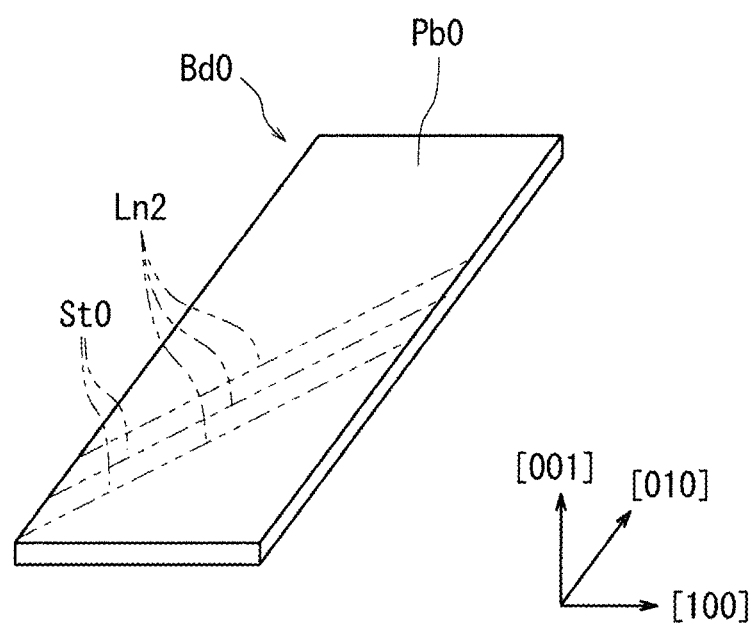
FIG. 6B illustrates a perspective view showing an appearance of an example of a seed crystal.

The first seed crystal portion 201s, the second seed crystal portion 202s, and the intermediate seed crystal portion 203s can be prepared, for example, as follows. For example, first, as shown in FIG. 6A, setting the crystal orientation of the Miller index along the direction in which the single crystal silicon is grown in the Czochralski (CZ) method to <100> obtains cylindrical single crystal silicon lumps (also referred to as single crystal silicon lumps) Mc0. Here, it is assumed that the single crystal silicon lump Mc0 includes an upper surface Pu0 with a plane orientation in the Miller index of (100) and an outer peripheral surface Pp0 where a specific linear region Ln0 with a plane orientation in the Miller index of (110) exists. In this case, next, as shown in FIG. 6A, the single crystal silicon lump Mc0 is cut with reference to the linear region Ln0 existing on the outer peripheral surface Pp0 of the single crystal silicon lump Mc0. In FIG. 6A, the position where the single crystal silicon lump Mc0 is cut (also referred to as position to be cut) is virtually drawn by a thin two-dot chain line Ln1. Here, from the single crystal silicon lump Mc0, for example, as shown in FIG. 6B, a plurality of single crystal silicon plates each having a rectangular plate surface Pb0 with a plane orientation in the Miller index of (100) Bd0 (also referred to as single crystal silicon plate) can be cut out. The plurality of single crystal silicon plates Bd0 can be used, for example, as a first seed crystal portion 201s and a second seed crystal portion 202s. In addition, as shown in FIG. 6B, for example, cutting the single crystal silicon plate Bd0 along the position to be cut virtually drawn by the two-dot chain line Ln2 allows a rod-shaped single crystal silicon (also referred to as single crystal silicon rod) St0 to be cut out from the single crystal silicon plate Bd0. At this time, the angle formed by the four sides of the plate surface Pb0 of the single crystal silicon plate Bd0 and the two-dot chain line Ln2 indicating the position to be cut is the rotation angle of the single crystal silicon corresponding to the coincidence boundary. The single crystal silicon rod St0 obtained here can be used, for example, as one single crystal silicon constituting the intermediate seed crystal portion 203s.

Here, for example, in the lower region in the mold 121, a silicon lump in a solid state may be arranged on the seed crystal portion group 200s of the single crystal silicon arranged on the bottom surface portion in the mold 121. As this silicon lump, a relatively fine block-shaped silicon lump is applied, for example.

Figure 7:
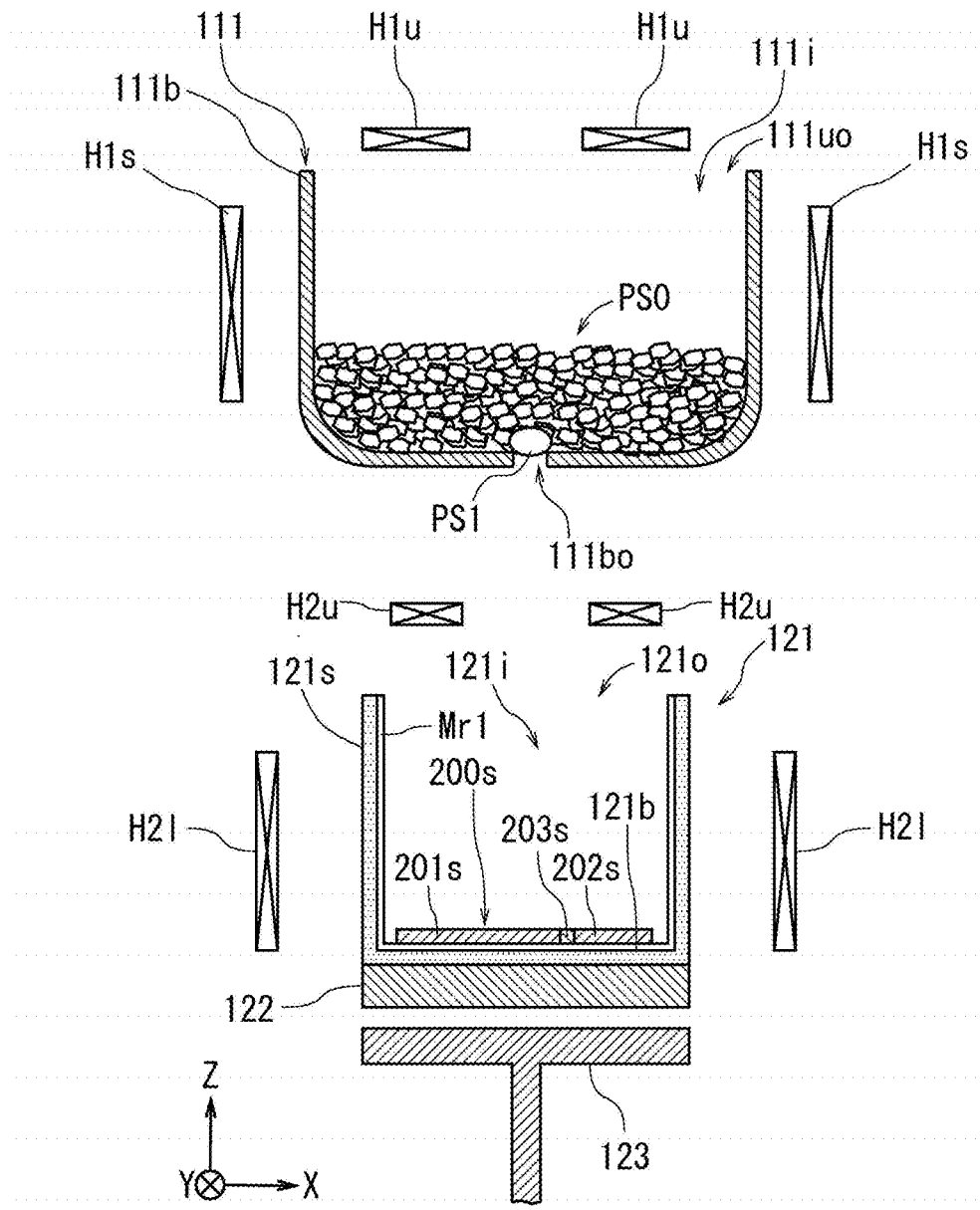
FIG. 7 illustrates a diagram showing an example of a virtual cutting plane portion of a manufacturing apparatus in a state where a crucible is filled with silicon lumps.

In step Sp23, as shown in FIG. 7, the silicon lumps PS0 are introduced into the first internal space 111i of the crucible 111. Here, for example, the silicon lumps PS0 are filled from the lower portion region toward the upper portion region in the crucible 111. At this time, for example, the element serving as a dopant in the silicon ingot In1 is mixed with the silicon lump PS0. As the silicon lump PS0, a polysilicon lump as a raw material for the silicon ingot In1 is applied, for example. As the polysilicon lump, a relatively fine block-shaped silicon lump is applied, for example. Here, when the p-type silicon ingot In1 is manufactured, as the element serving as the dopant, boron, gallium, or the like is applied, for example. When the n-type silicon ingot In1 is manufactured, as the element serving as the dopant, phosphorus or the like is applied, for example. In addition, here, for example, a silicon lump for closing (also referred to as closing silicon lump) PS1 is filled so as to close the upper part of the lower portion opening 111*bo* of the crucible 111. Thus, the path from the first internal space 111*i* to the lower portion opening 111*bo* is closed.

Here, for example, before the next third step is started, the cooling plate 123 may be set in a state where the cooling plate 123 is not grounded on the lower surface of the mold holding portion 122.

1-2-3. Third Step

In the third step of step Sp3, the silicone melt MS1 is poured into the mold 121 in a state where the seed crystal portion group 200*s* of the single crystal silicon arranged on the bottom surface portion in the mold 121 in the second step is heated to near the melting point of silicon, for example.

Figure 8:
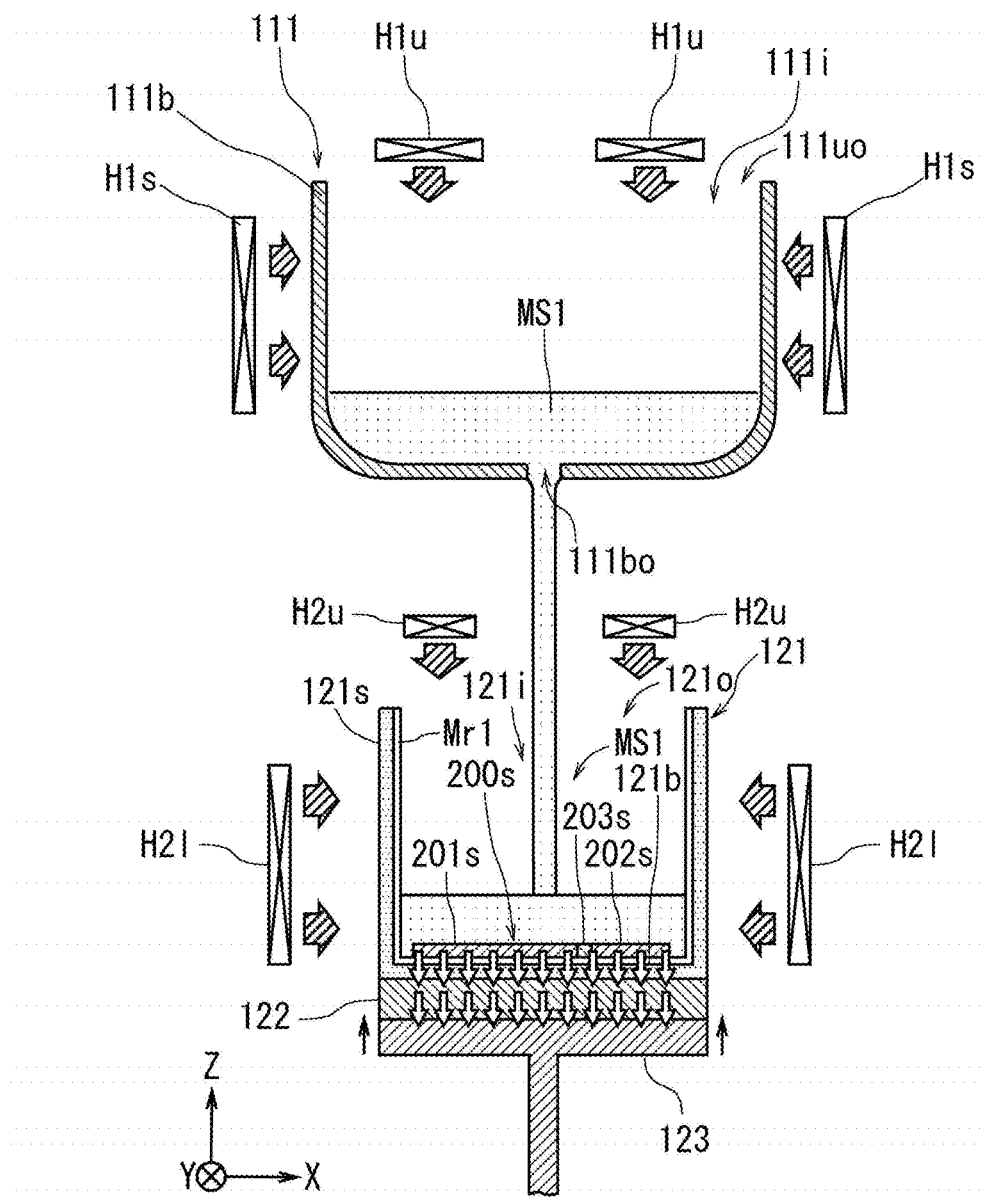
FIG. 8 illustrates a diagram showing an example of a virtual cutting plane portion of the manufacturing apparatus in a state where a silicon melt is poured into the mold from the crucible.

In the third step, for example, as shown in FIG. 8, the second upper portion heater H2*u* and the lower portion heater H2*l* arranged above and lateral to the mold 121 heat the silicon seed crystal portion group 200*s* to near 1414° C. being the silicon melting point. Here, for example, in the second step, if a silicon lump in a solid state is arranged on the seed crystal portion group 200*s* of the single crystal silicon arranged on the bottom surface portion in the mold 121, this silicon lump may be melted. Also in this case, since the seed crystal portion group 200*s* is in close contact with the bottom portion 121*b* of the mold 121, the seed crystal portion group 200*s* remains without being melted by heat transfer from the seed crystal portion group 200*s* to the bottom portion 121*b*.

In addition, in the third step, for example, as shown in FIG. 8, the silicon lump PS0 arranged in the crucible 111 is melted by heating, and the silicon melt MS1 is stored in the crucible 111. Here, for example, the first upper portion heater H1*u* and the side portion heater H1*s* arranged above and lateral to the crucible 111 heat the silicon lump PS0 to a temperature range of about 1414° C. to 1500° C., which exceeds the melting point of silicon, to the silicon melt MS1. At this time, heating the closing silicon lump PS1 closing the upper part of the lower portion opening 111*bo* of the crucible 111 melts the closing silicon lump PS1. A heater for melting the closing silicon lump PS1 may be present. Due to the melting of the closing silicon lump PS1, the path from the first internal space 111*i* to the lower portion opening 111*bo* of the crucible 111 is in a state of being opened. As a result, the silicon melt MS1 in the crucible 111 is poured into the mold 121 via the lower portion opening 111*bo*. Thus, as shown in FIG. 8, the upper surface of the seed crystal portion group 200*s* of the single crystal silicon arranged on the bottom surface portion in the mold 121 is in a state of being covered with the silicon melt MS1.

In addition, in the third step, for example, as shown in FIG. 8, the cooling plate 123 is grounded on the lower surface of the mold holding portion 122. Thus, heat removal from the silicon melt MS1 in the mold 121 to the cooling plate 123 via the mold holding portion 122 is started. Here, as the timing at which the cooling plate 123 is grounded on the lower surface of the mold holding portion 122 (also referred to as grounding timing), a timing may be applied at which a preset predetermined time has elapsed from the time when the silicon melt MS1 starts to be poured into the mold 121 from inside the crucible 111, for example. In addition, as the grounding timing, the timing immediately before the silicon melt MS1 starts to be poured into the mold 121 from inside the crucible 111 may be applied, for example. The grounding timing may be controlled according to the temperature detected by using the temperature measuring units of the manufacturing apparatus 100 such as the first temperature measuring unit CHA and the second temperature measuring unit CHB.

1-2-4. Fourth Step

In the fourth step of step Sp4, for example, the silicon melt MS1 poured into the mold 121 in the third step is solidified in one direction upward from the bottom surface portion side of the mold 121 (also referred to as unidirectional solidification).

Figure 9:
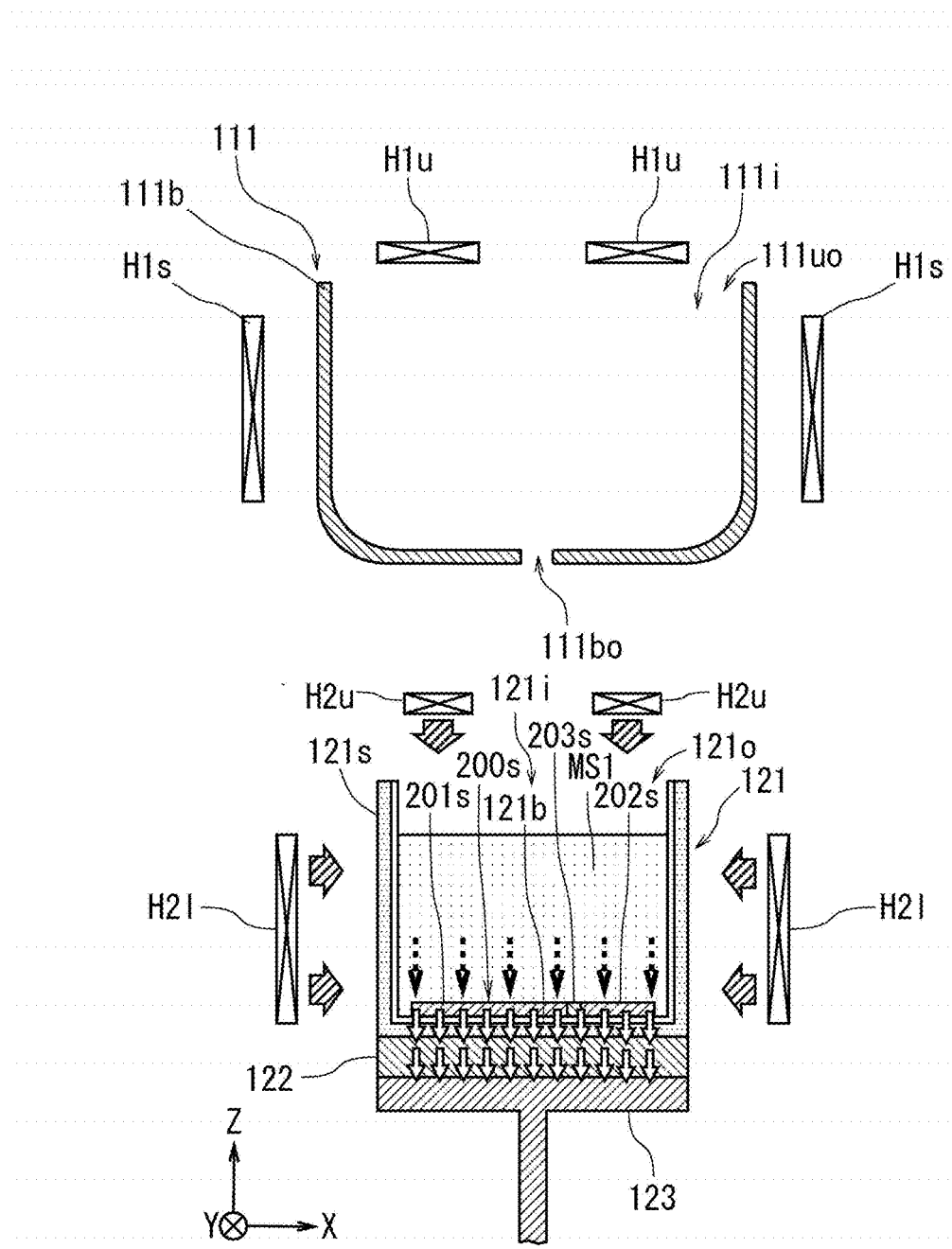
FIG. 9 illustrates a diagram showing an example of a virtual cutting plane portion of the manufacturing apparatus in a state where the silicon melt unidirectionally solidifies in the mold.

In the fourth step, for example, as shown in FIG. 9, the silicon melt MS1 in the mold 121 is cooled from the bottom surface portion side. Thus, unidirectional solidification is performed upward from the bottom surface portion side of the silicon melt MS1. At this time, for example, depending on the temperature detected by using the first temperature measuring unit CHA, the second temperature measuring unit CHB, and the like of the manufacturing apparatus 100, the thermal outputs of the second upper portion heater H2*u* and the lower portion heater H2*l* arranged above and lateral to the mold 121 are controlled. Here, for example, the temperature near the second upper portion heater H2*u* and the lower portion heater H2*l* is held at a temperature close to the melting point of silicon. Thus, the crystal growth of silicon from the side of the mold 121 is unlikely to occur, and the crystal growth of single crystal silicon in the upward +Z direction is likely to occur. At this time, for example, the lower portion heater H2*l* may be divided into a plurality of portions. In this case, for example, the silicon melt MS1 may be heated by the second upper portion heater H2*u* and part of the divided lower portion heater H2*l*, and the silicon melt MS1 does not have to be heated by the other part of the divided lower portion heater H2*l*.

In this fourth step, for example, slowly progressing the unidirectional solidification of the silicon melt MS1 manufactures the silicon ingot In1 in the mold 121. At this time, for example, the pseudo single crystal grows from each of the first seed crystal portion 201*s*, the intermediate seed crystal portion 203*s*, and the second seed crystal portion 202*s* included in the seed crystal portion group 200*s* of the single crystal silicon as a base point. Here, for example, a grain boundary including a coincidence boundary (also referred to as functional grain boundary) can be formed at the boundary between a pseudo single crystal grown from the first seed crystal portion 201*s* as a base point and a pseudo single crystal grown from the intermediate seed crystal portion 203*s* as a base point by inheriting the rotation angle relationship between the first seed crystal portion 201*s* and the intermediate seed crystal portion 203*s*. In other words, a coincidence boundary may be formed above the boundary between the first seed crystal portion 201*s* and the intermediate seed crystal portion 203*s*. In addition, for example, a functional grain boundary including a coincidence boundary can be formed at the boundary between a pseudo single crystal grown from the intermediate seed crystal portion 203s as a base point and a pseudo single crystal grown from the second seed crystal portion 202s as a base point by inheriting the rotation angle relationship between the intermediate seed crystal portion 203s and the second seed crystal portion 202s. In other words, a coincidence boundary may be formed above the boundary between the intermediate seed crystal portion 203s and the second seed crystal portion 202s. Thus, for example, when the unidirectional solidification of the silicon melt MS1 progresses, the distortion is relaxed when the coincidence boundary is formed at any time, and the defects in the silicon ingot In1 can be reduced. In addition, for example, when the unidirectional solidification of the silicon melt MS1 progresses, dislocations are relatively likely to occur between the first seed crystal portion 201s and the second seed crystal portion 202s, but dislocations are likely to disappear at the two functional grain boundaries, and dislocations are likely to be confined in the pseudo single crystal region sandwiched between the two functional grain boundaries. Here, for example, if the third seed width Ws3 of the intermediate seed crystal portion 203s is smaller than the first seed width Ws1 of the first seed crystal portion 201s and the second seed width Ws2 of the second seed crystal portion 202s, defects in the silicon ingot In1 to be manufactured can be reduced. Therefore, the quality of the silicon ingot In1 can be improved.

Here, for example, in the second step, the first seed crystal portion 201s, the intermediate seed crystal portion 203s, and the second seed crystal portion 202s may be arranged so that the first rotation angle relationship and the second rotation angle relationship have a rotation angle relationship corresponding to the coincidence boundary with a Σ value of 29, with the virtual axis along the <100> orientation in the Miller index as the rotation axis. In this case, for example, when the unidirectional solidification of the silicon melt MS1 progresses, a coincidence boundary with a Σ value of 29 (random grain boundary) can be formed above each of the boundary between the first seed crystal portion 201s and the intermediate seed crystal portion 203s and the boundary between the intermediate seed crystal portion 203s and the second seed crystal portion 202s. At this time, for example, defects are less likely to occur due to relaxation of distortion at random grain boundaries. This can further reduce, for example, defects in the manufactured silicon ingot In1. Therefore, the quality of the silicon ingot In1 can be further improved.

In addition, here, for example, in the second step, the first seed width Ws1 of the first seed crystal portion 201s and the second seed width Ws2 of the second seed crystal portion 202s in the +X direction as the second direction may be the same or different. In this case, for example, if the first seed width Ws1 and the second seed width Ws2 are different, the strip-shaped seed crystal portions having different widths cut out from the cylindrical single crystal silicon lump Mc0 obtained by the CZ method or the like can be used as the first seed crystal portion 201s and the second seed crystal portion 202s. Thus, for example, a high quality silicon ingot In1 can be easily manufactured.

In addition, here, for example, as shown in FIGS. 4A and 4B, a gap GA1 may be present between the outer peripheral portion of the seed crystal portion group 200s and the side surface portion of the inner wall of the mold 121 (also referred to as the inner peripheral side surface portion). Furthermore, for example, one or more seed crystals of single crystal silicon (also referred to as outer peripheral portion seed crystals) may be arranged in the gap GA1 so as to be adjacent to the seed crystal portion group 200s. In this case, for example, one or more single crystals may be arranged along the outer peripheral portion of the bottom portion 121b of the mold 121 so as to fill the annular gap GA1 between the outer peripheral portion of the seed crystal portion group 200s and the inner peripheral side surface portion of the mold 121. One or more outer peripheral portion seed crystals may include a seed crystal region positioned adjacent to the first seed crystal portion 201s (also referred to as first outer peripheral portion seed crystal region), and a seed crystal region positioned adjacent to the second seed crystal portion 202s (also referred to as second outer peripheral portion seed crystal region), for example.

Then, for example, between the first seed crystal portion 201s and the first outer peripheral portion seed crystal region, the angular relationship in the rotation direction about a virtual axis along the +Z direction as the first direction is set to be the rotation angle relationship of the single crystal silicon corresponding to the coincidence boundary. In addition, for example, between the second seed crystal portion 202s and the second outer peripheral portion seed crystal region, the angular relationship in the rotation direction about a virtual axis along the +Z direction as the first direction is set so as to be the rotation angle relationship of the single crystal silicon corresponding to the coincidence boundary. If such a configuration is adopted, for example, a functional grain boundary including a coincidence boundary is likely to be formed at the boundary between a pseudo single crystal grown from the first seed crystal portion 201s as a base point and a pseudo single crystal grown from the first outer peripheral portion seed crystal region as a base point by inheriting the rotation angle relationship between the first seed crystal portion 201s and the first outer peripheral portion seed crystal region. In other words, a coincidence boundary may be formed above the boundary between the first seed crystal portion 201s and the first outer peripheral portion seed crystal region. In addition, for example, a functional grain boundary including a coincidence boundary is likely to be formed at the boundary between a pseudo single crystal grown from the second seed crystal portion 202s as a base point and a pseudo single crystal grown from the second outer peripheral portion seed crystal region as a base point by inheriting the rotation angle relationship between the second seed crystal portion 202s and the second outer peripheral portion seed crystal region. In other words, a coincidence boundary may be formed above the boundary between the second seed crystal portion 202s and the second outer peripheral portion seed crystal region. Thus, for example, when the unidirectional solidification of the silicon melt MS1 progresses, the distortion is relaxed when the coincidence boundary is formed at any time, and the defects in the silicon ingot In1 can be reduced. In addition, for example, when the unidirectional solidification of the silicon melt MS1 progresses, even if dislocation occurs starting from the inner peripheral side surface portion of the mold 121 as a base point, dislocation progress (also referred to as dislocation propagation) can be blocked at functional grain boundaries positioned annularly along the inner peripheral side surface portion of the mold 121. As a result, defects in the pseudo single crystal grown from the first seed crystal portion 201s as a base point and the pseudo single crystal grown from the second seed crystal portion 202s as a base point can be reduced. In other words, defects in the manufactured silicon ingot In1 can be reduced.

1-3. Silicon Ingot

The configuration of the silicon ingot In1 according to one embodiment will be described with reference to FIGS. 10A and 10B. In the examples in FIGS. 10A and 10B, the shape of the silicon ingot In1 is a rectangular parallelepiped shape. This silicon ingot In1 can be manufactured, for example, by the method for manufacturing the silicon ingot In1 using the manufacturing apparatus 100 described above.

Figure 10A:
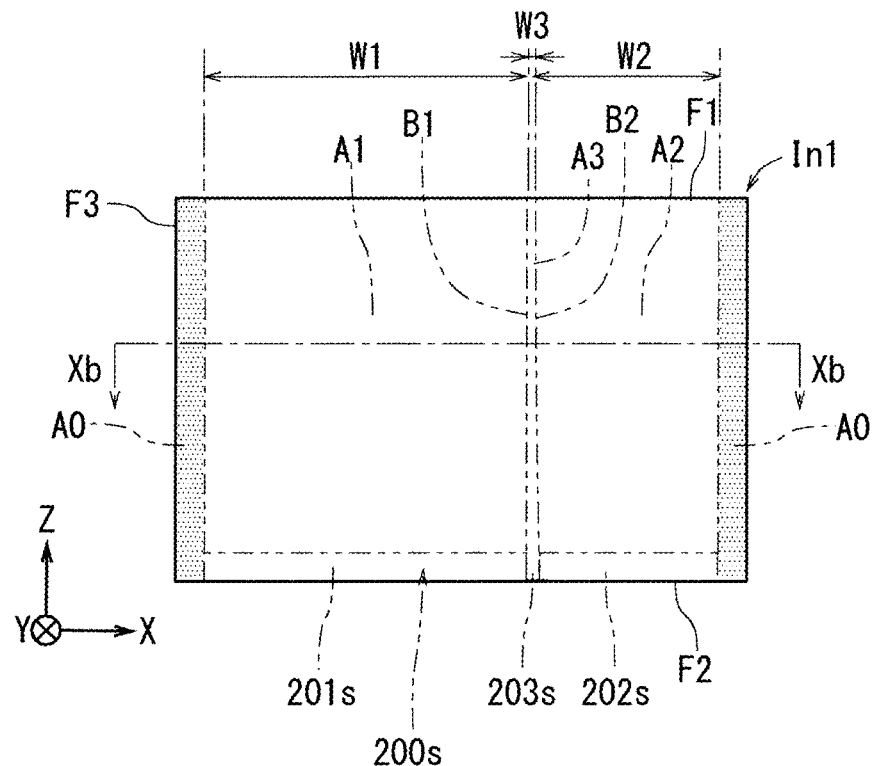
FIG. 10A illustrates a cross-sectional view showing an example of a cross section of a silicon ingot.
Figure 10B:
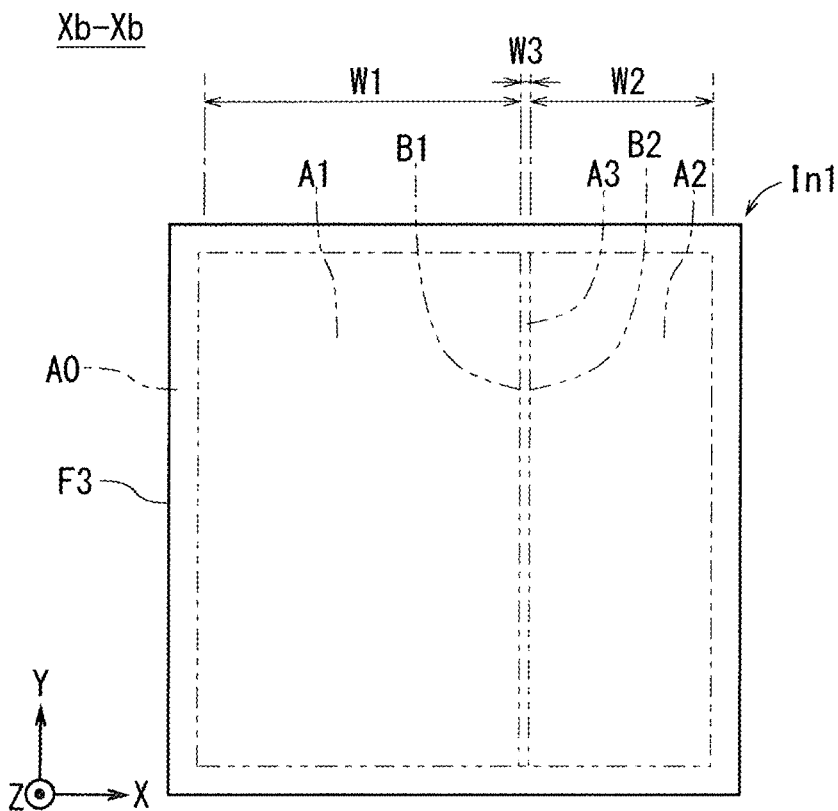
FIG. 10B illustrates a cross-sectional view showing an example of a cross section of the silicon ingot taken along line Xb-Xb in FIG. 10A.

As shown in FIGS. 10A and 10B, the silicon ingot In1 has, for example, a first surface F1, a second surface F2, and a third surface F3. In the examples in FIGS. 10A and 10B, the first surface F1 is a rectangular or square surface (also referred to as upper surface) facing the +Z direction as the first direction. The second surface F2 is positioned on the opposite side of the first surface F1. In the examples in FIGS. 10A and 10B, the second surface F2 is a rectangular or square surface (also referred to as lower surface) facing the −Z direction as the fourth direction opposite to the first direction. The third surface F3 is positioned along the first direction in a state of connecting the first surface F1 and the second surface F2. In the examples in FIGS. 10A and 10B, the third surface F3 is positioned in a state of connecting the upper surface and the lower surface along the +Z direction as the first direction, and includes four surfaces (also referred to as side surfaces) along the +Z direction as the first direction.

In addition, the silicon ingot In1 includes, for example, a first pseudo single crystal region A1, a second pseudo single crystal region A2, and a first intermediate region A3. The first pseudo single crystal region A1, the first intermediate region A3, and the second pseudo single crystal region A2 are positioned in a state of being adjacent in the order of this description in the +X direction as the second direction perpendicular to the +Z direction as the first direction.

The first pseudo single crystal region A1 is a region being constituted by pseudo single crystal. The first pseudo single crystal region A1 is a region formed so as to inherit the crystal structure and crystal orientation of the first seed crystal portion 201s by, for example, unidirectional solidification of the silicon melt MS1 starting from the first seed crystal portion 201s as a base point. Therefore, the first pseudo single crystal region A1 includes, for example, a region corresponding to the first seed crystal portion 201s and a region positioned above the region corresponding to the first seed crystal portion 201s. In the examples in FIGS. 10A and 10B, the region corresponding to the first seed crystal portion 201s is a rectangular parallelepiped shaped region having a rectangular upper surface facing the +Z direction as the first direction and a rectangular lower surface facing the −Z direction as the fourth direction. Then, the first pseudo single crystal region A1 is a rectangular parallelepiped shaped region including a region corresponding to the rectangular parallelepiped shaped first seed crystal portion 201s as the lowermost portion.

The second pseudo single crystal region A2 is a region being constituted by pseudo single crystal. The second pseudo single crystal region A2 is a region formed so as to inherit the crystal structure and crystal orientation of the second seed crystal portion 202s by, for example, unidirectional solidification of the silicon melt MS1 starting from the second seed crystal portion 202s as a base point. Therefore, the second pseudo single crystal region A2 includes, for example, a region corresponding to the second seed crystal portion 202s and a region positioned above the region corresponding to the second seed crystal portion 202s. In the examples in FIGS. 10A and 10B, the region corresponding to the second seed crystal portion 202s is a rectangular parallelepiped shaped region having a rectangular upper surface facing the +Z direction as the first direction and a rectangular lower surface facing the −Z direction as the fourth direction. Then, the second pseudo single crystal region A2 is a rectangular parallelepiped shaped region including a region corresponding to the rectangular parallelepiped shaped second seed crystal portion 202s as the lowermost portion.

The first intermediate region A3 includes one or more pseudo single crystal regions. The first intermediate region A3 is a region formed so as to inherit the crystal structure and crystal orientation of the intermediate seed crystal portion 203s by, for example, unidirectional solidification of the silicon melt MS1 starting from the intermediate seed crystal portion 203s as a base point. Therefore, the first intermediate region A3 includes, for example, a region corresponding to the intermediate seed crystal portion 203s and a region positioned above the region corresponding to the intermediate seed crystal portion 203s. In the examples in FIGS. 10A and 10B, the region corresponding to the intermediate seed crystal portion 203s is a rod-shaped region having an elongated rectangular upper surface facing the +Z direction as the first direction and an elongated rectangular lower surface facing the −Z direction as the fourth direction. Then, the first intermediate region A3 is plate-shaped region including a region corresponding to the rod-shaped intermediate seed crystal portion 203s as the lowermost portion. In this case, for example, each shape of the boundary between the first pseudo single crystal region A1 and the first intermediate region A3 (also referred to as the first boundary) B1, and the boundary between the second pseudo single crystal region A2 and the first intermediate region A3 (also referred to as the second boundary) B2 is rectangular in the shape along the YZ plane.

In addition, here, for example, in the +X direction as the second direction, each of the width of the first pseudo single crystal region A1 (also referred to as the first width) W1 and the width of the second pseudo single crystal region A2 (also referred to as the second width) W2 is larger than the width of the first intermediate region A3 (also referred to as the third width) W3. Here, for example, it is assumed that each of the first surface F1 and the second surface F2 of the silicon ingot In1 has a rectangular shape or a square shape having a side length of about 350 mm. In this case, for example, each of the first width W1 of the first pseudo single crystal region A1 and the second width W2 of the second pseudo single crystal region A2 is assumed to be about 50 mm to 250 mm, and the third width W3 of the first intermediate region A3 is assumed to be about 2 mm to 25 mm.

In addition, here, for example, each of the first boundary B1 between the first pseudo single crystal region A1 and the first intermediate region A3 and the second boundary B2 between the second pseudo single crystal region A2 and the first intermediate region A3 has a coincidence boundary. Here, for example, it is assumed that the plane orientation of the plane perpendicular to the +Z direction as the first direction in each of the first pseudo single crystal region A1, the first intermediate region A3, and the second pseudo single crystal region A2 is (100) in the Miller index. From another point of view, for example, it is assumed that the crystal orientation along the +Z direction as the first direction in each of the first pseudo single crystal region A1, the first intermediate region A3, and the second pseudo single crystal region A2 is <100> in the Miller index. In this case, the coincidence boundary includes any one of, for example, a coincidence boundary with a Σ value of 5, a coincidence boundary with a Σ value of 13, a coincidence boundary with a Σ value of 17, a coincidence boundary with a Σ value of 25, and a coincidence boundary with a Σ value of 29. The silicon ingot In1 having such a configuration can be achieved by, for example, growing a pseudo single crystal from the seed crystal portion group 200s as a base point and forming a coincidence boundary above each of the boundary between the first seed crystal portion 201s and the intermediate seed crystal portion 203s and the boundary between the second seed crystal portion 202s and the intermediate seed crystal portion 203s. Then, when the coincidence boundary is formed, the silicon ingot In1 is less likely to be defective due to the relaxation of distortion, for example. Therefore, here, for example, if the above configuration of the silicon ingot In1 suitable for manufacturing the silicon ingot In1 in which defects are less likely to occur is adopted, the quality of the silicon ingot In1 can be improved by reducing the defects. Here, the existence of various coincidence boundaries and the abundance ratio of various coincidence boundaries at each of the first boundary B1 and the second boundary B2 can be checked by measurement using, for example, the EBSD method.

In addition, here, for example, as shown in FIGS. 10A and 10B, the silicon ingot In1 may have a region positioned along the third surface F3 including four side surfaces (also referred to as outer peripheral portion region) A0. The outer peripheral portion region A0 may include, for example, defects due to dislocations generated from the inner peripheral side surface portion of the mold 121 as a base point when the unidirectional solidification of the silicon melt MS1 progresses. This outer peripheral portion region A0 is cut off from the silicon ingot In1 when a silicon block Bk1 (see FIGS. 11A, 11B, and the like) and a silicon substrate 1 (see FIGS. 15A, 15B, and the like) described below are manufactured.

In addition, here, for example, the crystal orientation along the +Z direction as the first direction in each of one or more pseudo single crystal regions of the first pseudo single crystal region A1, the second pseudo single crystal region A2, and the first intermediate region A3 may be the <100> orientation in the Miller index. This configuration can be achieved by, for example, arranging the seed crystal portion group 200s on the bottom portion 121b of the mold 121 so that the plane orientation of the upper surface is (100) in the Miller index and inheriting the crystal orientation of the seed crystal portion group 200s to grow the silicon melt MS1 in one direction. In addition, in this case, for example, the crystal growth rate when unidirectional solidification of the silicon melt MS1 is to be performed can be improved. Thus, for example, a first pseudo single crystal region A1, a first intermediate region A3, and a second pseudo single crystal region A2 formed by growing crystal grains upward starting from each of the first seed crystal portion 201s, the intermediate seed crystal portion 203s, and the second seed crystal portion 202s can be easily obtained. As a result, the quality of the silicon ingot In1 can be easily improved.

Furthermore, here, for example, the coincidence boundary positioned at each of the first boundary B1 between the first pseudo single crystal region A1 and the first intermediate region A3 and the second boundary B2 between the second pseudo single crystal region A2 and the first intermediate region A3 may include a coincidence boundary with a Σ value of 29. Here, for example, a case of growing a pseudo single crystal from the seed crystal portion group 200s as a base point to manufacture a silicon ingot In1 is assumed. In this case, for example, when a random grain boundary with a Σ value of 29 is formed, at any time, above each of the boundary between the first seed crystal portion 201s and the intermediate seed crystal portion 203s and the boundary between the second seed crystal portion 202s and the intermediate seed crystal portion 203s, distortion is further relaxed at this random grain boundary, and defects are less likely to occur. Therefore, for example, if the above configuration of the silicon ingot In1 suitable for manufacturing the silicon ingot In1 in which defects are less likely to occur is adopted, the quality of the silicon ingot In1 can be further improved by reducing the defects.

In addition, here, for example, the first width W1 of the first pseudo single crystal region A1 and the second width W2 of the second pseudo single crystal region A2 may be the same or different. For example, if the first width W1 and the second width W2 are different, in the mono-like casting method, the first seed crystal portion 201s and the second seed crystal portion 202s having different widths can be arranged on the bottom portion 121b of the mold 121. Therefore, for example, the strip-shaped seed crystal portions having different widths cut out from the cylindrical single crystal silicon lump Mc0 obtained by the CZ method or the like can be used as the first seed crystal portion 201s and the second seed crystal portion 202s. Thus, for example, a high quality silicon ingot In1 can be easily manufactured. In other words, for example, the quality of the silicon ingot In1 can be easily improved.

1-4. Silicon Block

The configuration of a silicon block Bk1 according to one embodiment will be described with reference to FIGS. 11A and 11B. In the examples in FIGS. 11A and 11B, the shape of the silicon block Bk1 is a rectangular parallelepiped shape. The silicon block Bk1 can be manufactured, for example, by cutting out the outer peripheral portion of the silicon ingot In1, which is likely to be relatively defective, from the above-described silicon ingot In1 with a wire saw apparatus or the like. Here, the outer peripheral portion of the silicon ingot In1 includes, for example, in the silicon ingot In1, a portion having a first thickness along the first surface F1, a portion having a second thickness along the second surface F2, and a portion having a third thickness along the third surface F3. The first thickness is, for example, about several mm to 20 mm. The second thickness is, for example, a thickness to the degree that the region corresponding to the seed crystal portion group 200s is cut off. The third thickness is, for example, a thickness to the degree that the outer peripheral portion region A0 is cut off.

Figure 11A:
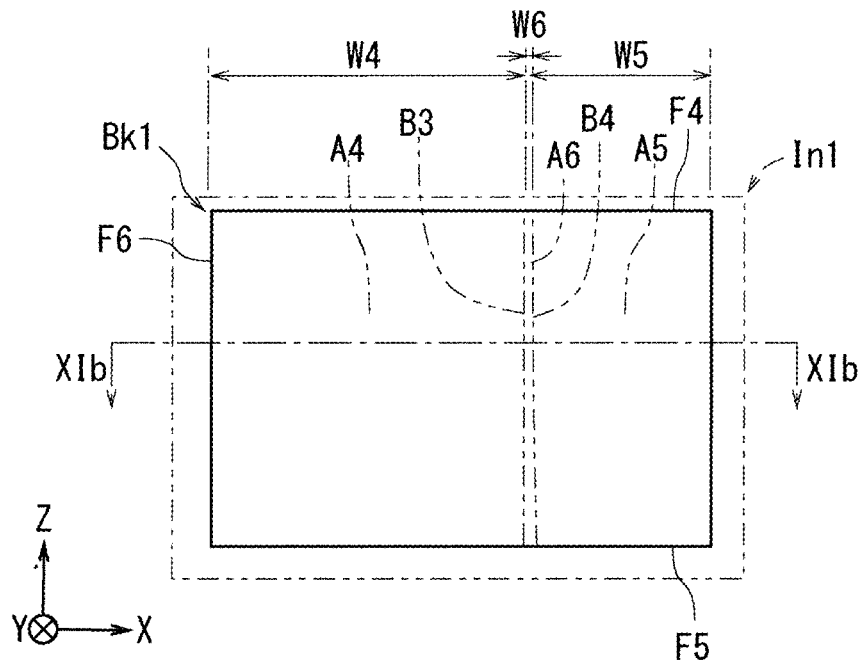
FIG. 11A illustrates a cross-sectional view showing an example of a cross section of the silicon block.
Figure 11B:
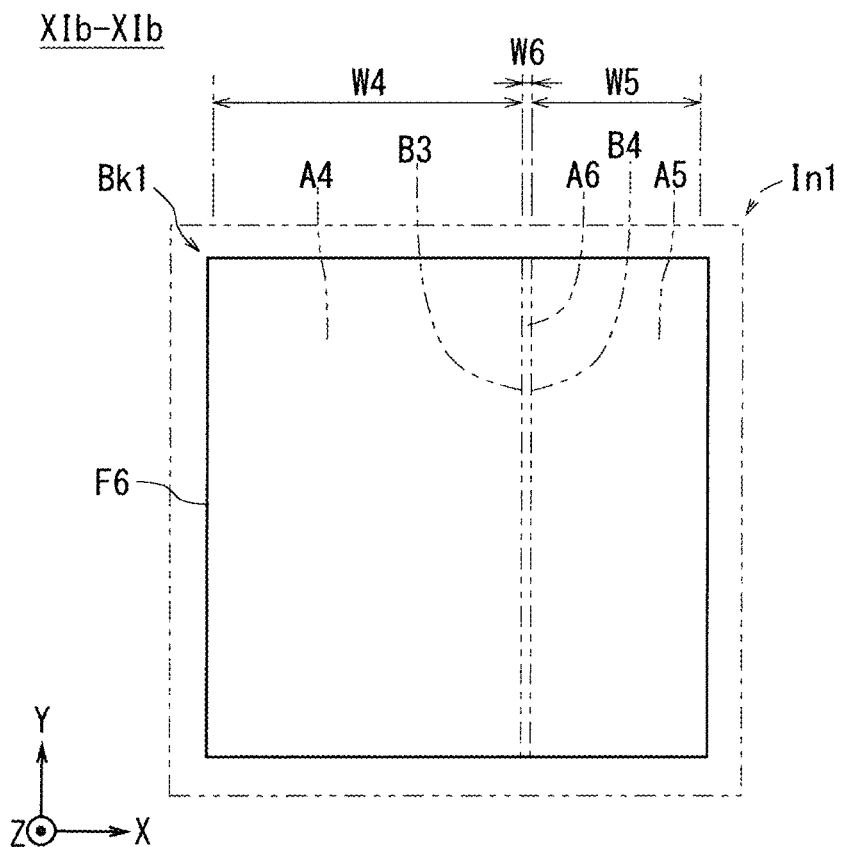
FIG. 11B illustrates a cross-sectional view showing an example of a cross section of the silicon block taken along line XIb-XIb in FIG. 11A.

As shown in FIGS. 11A and 11B, the silicon block Bk1 has, for example, a fourth surface F4, a fifth surface F5, and a sixth surface F6. In the examples in FIGS. 11A and 11B, the fourth surface F4 is a rectangular or square surface (also referred to as upper surface) facing the +Z direction as the first direction. The fifth surface F5 is positioned on the opposite side of the fourth surface F4. In the examples in FIGS. 11A and 11B, the fifth surface F5 is a rectangular or square surface (also referred to as lower surface) facing the −Z direction as the fourth direction opposite to the first direction. The sixth surface F6 is positioned along the first direction in a state of connecting the fourth surface F4 and the fifth surface F5. In the examples in FIGS. 11A and 11B, the sixth surface F6 is positioned in a state of connecting the upper surface and the lower surface along the +Z direction as the first direction, and includes four surfaces (also referred to as side surfaces) along the +Z direction as the first direction.

In addition, the silicon block Bk1 includes, for example, a third pseudo single crystal region A4, a fourth pseudo single crystal region A5, and a second intermediate region A6. The third pseudo single crystal region A4, the second intermediate region A6, and the fourth pseudo single crystal region A5 are positioned in a state of being adjacent in the order of this description in the +X direction as the second direction perpendicular to the +Z direction as the first direction.

The third pseudo single crystal region A4 is a region being constituted by pseudo single crystal. The third pseudo single crystal region A4 is, for example, a region formed by at least a part of the first pseudo single crystal region A1 of the silicon ingot In1. In the examples in FIGS. 11A and 11B, the third pseudo single crystal region A4 is a rectangular parallelepiped shaped region having a rectangular upper surface facing the +Z direction as the first direction and a rectangular lower surface facing the −Z direction as the fourth direction.

The fourth pseudo single crystal region A5 is a region being constituted by pseudo single crystal. The fourth pseudo single crystal region A5 is, for example, a region formed by at least a part of the second pseudo single crystal region A2 of the silicon ingot In1. In the examples in FIGS. 11A and 11B, the fourth pseudo single crystal region A5 is a rectangular parallelepiped shaped region having a rectangular upper surface facing the +Z direction as the first direction and a rectangular lower surface facing the −Z direction as the fourth direction.

The second intermediate region A6 includes one or more pseudo single crystal regions. The second intermediate region A6 is, for example, a region formed by at least a part of the first intermediate region A3 of the silicon ingot In1. In the examples in FIGS. 11A and 11B, the second intermediate region A6 is a plate-shaped region having an elongated rectangular upper surface facing the +Z direction as the first direction and an elongated rectangular lower surface facing the −Z direction as the fourth direction. In this case, for example, each shape of the boundary between the third pseudo single crystal region A4 and the second intermediate region A6 (also referred to as the third boundary) B3, and the boundary between the fourth pseudo single crystal region A5 and the second intermediate region A6 (also referred to as the fourth boundary) B4 is rectangular in the shape along the YZ plane.

In addition, here, for example, in the +X direction as the second direction, each of the width of the third pseudo single crystal region A4 (also referred to as the fourth width) W4 and the width of the fourth pseudo single crystal region A5 (also referred to as the fifth width) W5 is larger than the width of the second intermediate region A6 (also referred to as the sixth width) W6. Here, for example, it is assumed that each of the fourth surface F4 and the fifth surface F5 in the silicon block Bk1 has a rectangular shape or a square shape having a side length of about 300 mm to 320 mm. In this case, for example, each of the fourth width W4 of the third pseudo single crystal region A4 and the fifth width W5 of the fourth pseudo single crystal region A5 is assumed to be about 50 mm to 250 mm, and the sixth width W6 of the second intermediate region A6 is assumed to be about 2 mm to 25 mm.

In addition, for example, each of the third boundary B3 between the third pseudo single crystal region A4 and the second intermediate region A6 and the fourth boundary B4 between the fourth pseudo single crystal region A5 and the second intermediate region A6 has a coincidence boundary. Here, for example, it is assumed that the plane orientation of the plane perpendicular to the +Z direction as the first direction in each of the third pseudo single crystal region A4, the second intermediate region A6, and the fourth pseudo single crystal region A5 is (100) in the Miller index. From another point of view, for example, it is assumed that the crystal orientation along the +Z direction as the first direction in each of the third pseudo single crystal region A4, the second intermediate region A6, and the fourth pseudo single crystal region A5 is <100> in the Miller index. In this case, the coincidence boundary includes any one of, for example, a coincidence boundary with a Σ value of 5, a coincidence boundary with a Σ value of 13, a coincidence boundary with a Σ value of 17, a coincidence boundary with a Σ value of 25, and a coincidence boundary with a Σ value of 29. The silicon block Bk1 having such a configuration can be achieved by, for example, growing a pseudo single crystal from the seed crystal portion group 200s as a base point and forming a coincidence boundary above each of the boundary between the first seed crystal portion 201s and the intermediate seed crystal portion 203s and the boundary between the second seed crystal portion 202s and the intermediate seed crystal portion 203s. Then, when the coincidence boundaries are formed, for example, defects are less likely to occur in the silicon ingot In1 due to the relaxation of distortion, and defects in the silicon block Bk1 obtained by cutting off the outer peripheral portion of the silicon ingot In1 can also be reduced. Therefore, here, for example, if the above configuration of the silicon block Bk1 suitable for manufacturing the silicon block Bk1 whose defects can be reduced is adopted, the quality of the silicon block Bk1 can be improved by reducing the defects. Here, the existence of various coincidence boundaries and the abundance ratio of various coincidence boundaries at each of the third boundary B3 and the fourth boundary B4 can be checked using, for example, the EBSD method.

In addition, here, for example, the crystal orientation along the +Z direction as the first direction in each of one or more pseudo single crystal regions of the third pseudo single crystal region A4, the fourth pseudo single crystal region A5, and the second intermediate region A6 may be the <100> orientation in the Miller index. This configuration can be achieved by, for example, arranging the seed crystal portion group 200s on the bottom portion 121b of the mold 121 so that the plane orientation of the upper surface is (100) in the Miller index and inheriting the crystal orientation of the seed crystal portion group 200s to grow the silicon melt MS1 in one direction. In addition, in this case, for example, the crystal growth rate when unidirectional solidification of the silicon melt MS1 is to be performed can be improved. Thus, for example, the silicon ingot In1 including a first pseudo single crystal region A1, a first intermediate region A3, and a second pseudo single crystal region A2 formed by growing crystal grains upward starting from each of the first seed crystal portion 201s, the intermediate seed crystal portion 203s, and the second seed crystal portion 202s can be easily manufactured. Then, for example, cutting out the silicon block Bk1 from the silicon ingot In1 allows the quality of the silicon block Bk1 to be easily improved.

Furthermore, here, for example, the coincidence boundary positioned at each of the third boundary B3 between the third pseudo single crystal region A4 and the second intermediate region A6 and the fourth boundary B4 between the fourth pseudo single crystal region A5 and the second intermediate region A6 may include a coincidence boundary with a Σ value of 29. Here, for example, a case of growing a pseudo single crystal from the seed crystal portion group 200s as a base point to manufacture a silicon ingot In1 is assumed. In this case, for example, while a random grain boundary with a Σ value of 29 is formed, at any time, above each of the boundary between the first seed crystal portion 201s and the intermediate seed crystal portion 203s and the boundary between the second seed crystal portion 202s and the intermediate seed crystal portion 203s, distortion is further relaxed at this random grain boundary, and defects are less likely to occur. Therefore, for example, if the above configuration of the silicon block Bk1 suitable for manufacturing the silicon ingot In1 in which defects are less likely to occur is adopted, the quality of the silicon block Bk1 can be further improved by reducing the defects.

In addition, here, for example, the fourth width W4 of the third pseudo single crystal region A4 and the fifth width W5 of the fourth pseudo single crystal region A5 may be the same or different. For example, if the fourth width W4 and the fifth width W5 are different, in the mono-like casting method, the first seed crystal portion 201s and the second seed crystal portion 202s having different widths can be arranged on the bottom portion 121b of the mold 121. Therefore, for example, the strip-shaped seed crystal portions having different widths capable of being cut out from the cylindrical single crystal silicon lump Mc0 obtained by the CZ method or the like can be used as the first seed crystal portion 201s and the second seed crystal portion 202s. Thus, for example, a high quality silicon block Bk1 can be easily manufactured. In other words, for example, the quality of the silicon block Bk1 can be easily improved.

Figure 12A:
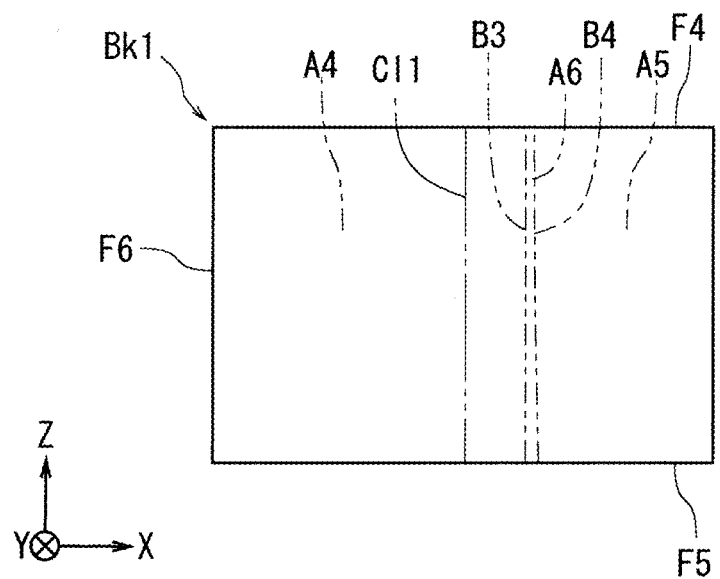
FIG. 12A illustrates a front view showing an example of a position where the silicon block is cut.
Figure 12B:
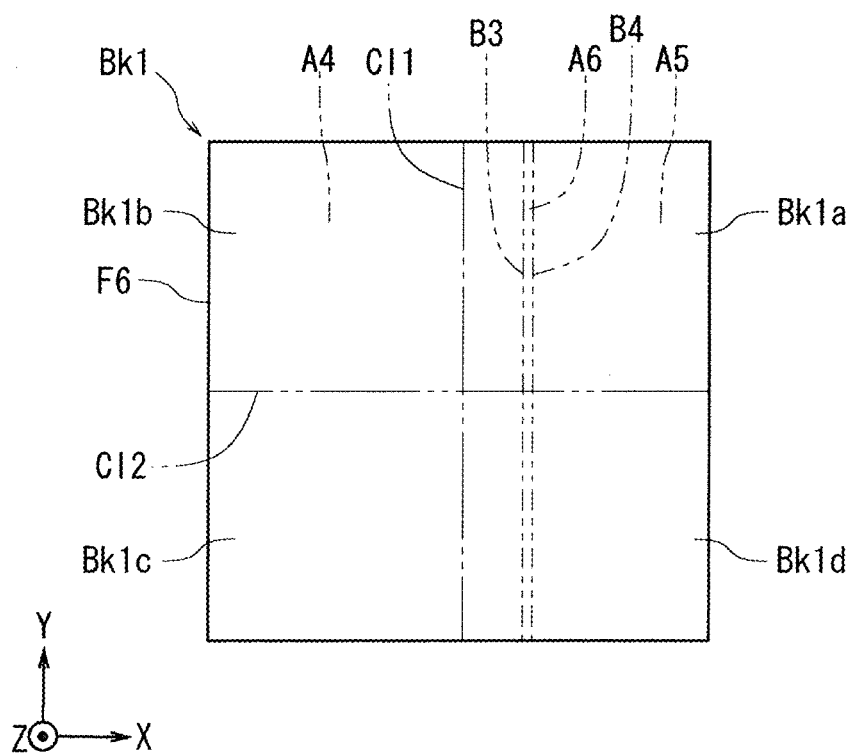
FIG. 12B illustrates a plan view showing an example of the position where the silicon block is cut.
Figure 13A:
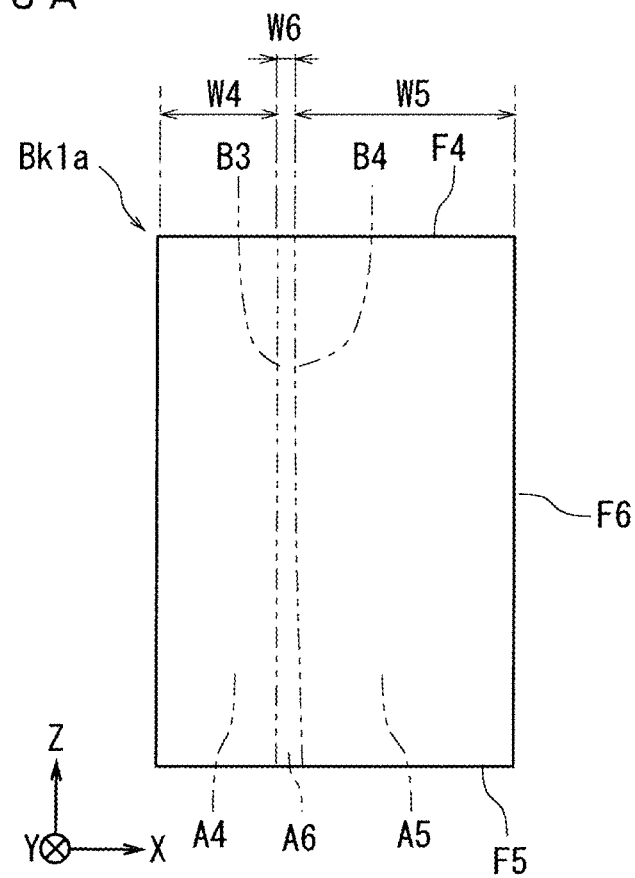
FIG. 13A illustrates a front view showing an example of a first small silicon block.
Figure 13B:
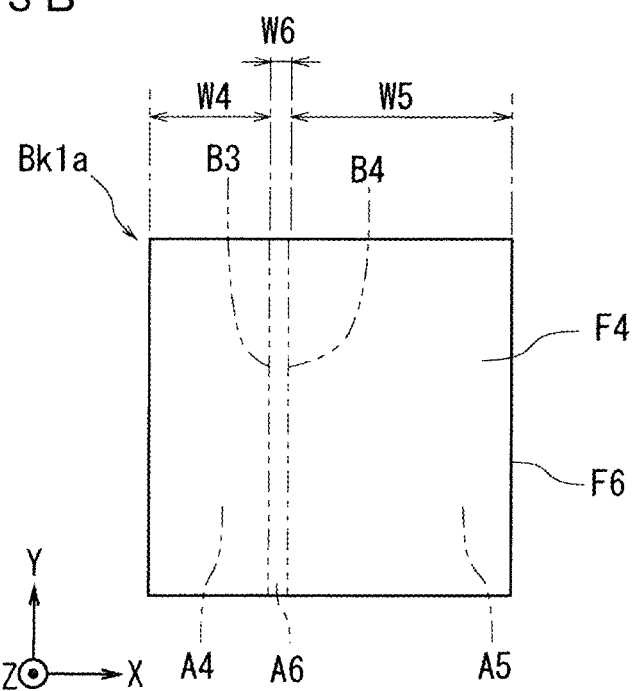
FIG. 13B illustrates a plan view showing an example of the first small silicon block.

Here, for example, as illustrated in FIGS. 12A and 12B. it is assumed that in order to manufacture the silicon substrate 1, the silicon block Bk1 is bisected in the +X direction as the second direction and the silicon block Bk1 is bisected in the +Y direction as the third direction perpendicular to the second direction. Here, for example, cutting the silicon block Bk1 along the first cutting plane C11 along the YZ plane and along the second cutting plane C12 along the XZ plane allows four relatively small silicon blocks (also referred to as small silicon blocks) to be obtained. The four small silicon blocks include a first small silicon block Bk1a, a second small silicon block Bk1b, a third small silicon block Bk1c, and a fourth small silicon block Bk1d. The silicon block Bk1 is cut by, for example, a wire saw apparatus. In the examples in FIGS. 12A and 12B, each of the first small silicon block Bk1a and the fourth small silicon block Bk1d includes the third pseudo single crystal region A4, the second intermediate region A6, and the fourth pseudo single crystal region A5. In addition, each of the second small silicon block Bk1b and the third small silicon block Bk1c includes the third pseudo single crystal region A4. In this case, for example, as shown in FIGS. 13A and 13B, in the first small silicon block Bk1a, in the +X direction as the second direction, each of the fourth width W4 of the third pseudo single crystal region A4 and the fifth width W5 of the fourth pseudo single crystal region A5 may be larger than the sixth width W6 of the second intermediate region A6. The fourth width W4 and the fifth width W5 may be the same or different.

Figure 14:
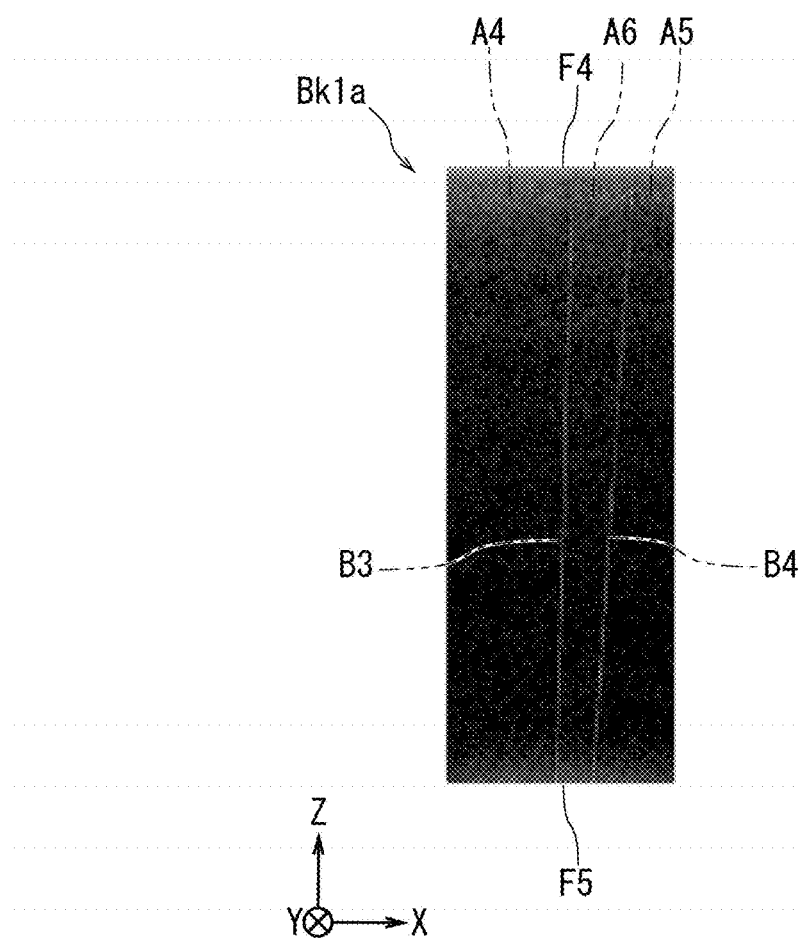
FIG. 14 illustrates a diagram showing an example of a distribution of lifetime in one cross section of the first small silicon block.

Here, the XZ cross section of the first small silicon block Bk1a as the measurement target surface is cleaned with ethanol or the like, and then the distribution of lifetime being the time required for recombination of minority carriers on the surface is measured using a lifetime measuring instrument. The result is shown in FIG. 14. With the lifetime measuring instrument, the intensity of microwaves emitted from the measurement target surface was detected in response to irradiation of the measurement target surface with a laser beam, and the time required for the intensity of microwaves to decrease from the reference value at the time of laser irradiation to the specified value after laser irradiation was defined as the measured value of the lifetime. As shown in FIG. 14, despite the presence of the second intermediate region A6, it was confirmed that the white region with a relatively short lifetime is hardly seen, and the black region with a relatively long lifetime occupies almost the entire area. In addition, here, even if the third seed width Ws3 of the intermediate seed crystal portion 203s is changed in the range of 5 mm to 20 mm, despite the presence of the second intermediate region A6, it was confirmed that the white region with a relatively short lifetime is hardly seen, and the black region with a relatively long lifetime occupies almost the entire area. Thus, it was estimated that the first small silicon block Bk1a is a high quality silicon block with few defects. As a result, it was estimated that the original silicon block Bk1 from which the first small silicon block Bk1a was cut out was also a high-quality silicon block Bk1 with few defects. In addition, it was estimated that the original silicon ingot In1 from which the silicon block Bk1 was cut out is also a high-quality silicon ingot In1 with few defects in the first pseudo single crystal region A1, the second pseudo single crystal region A2, and the first intermediate region A3.

In addition, as shown in FIG. 14, it is assumed that the silicon ingot In1 including the second boundary B2 corresponding to the fourth boundary B4 positioned to extend diagonally upward is manufactured. In this case, when the melt MS1 is unidirectionally solidified in the mold 121 from the bottom portion 121b side upward (+Z direction), if the silicon melt MS1 solidifies so that the second boundary B2 is formed above the dislocations propagating upward from the bottom portion 121b side, upward propagation of dislocations can be blocked by the second boundary B2. This can reduce, for example, defects in the manufactured silicon ingot In1, silicon block Bk1, and first small silicon block Bk1a.

1-5. Silicon Substrate

The configuration of the silicon substrate 1 according to one embodiment will be described with reference to FIGS. 15A and 15B. In the examples in FIGS. 15A and 15B, the silicon substrate 1 has a plate shape having a rectangular front and back surfaces. This silicon substrate 1 can be manufactured by, for example, slicing a small silicon block such as the first small silicon block Bk1a described above along the XY plane parallel to the fourth surface F4 and the fifth surface F5 at predetermined intervals in the +Z direction as the first direction. In the examples in FIGS. 15A and 15B, the silicon substrate 1 produced by slicing the first small silicon blocks Bk1a is shown. Here, for example, using a wire saw apparatus or the like to slice the first small silicon block Bk1a allows a silicon substrate 1 having a square plate surface having a thickness of about 100 micrometers (μm) to about 300 μm and a side of about 150 mm to be produced. The damaged layer in the surface layer of the silicon substrate 1 occurring when the small silicon block is cut can be removed by etching using a sodium hydroxide solution or the like.

Figure 15A:
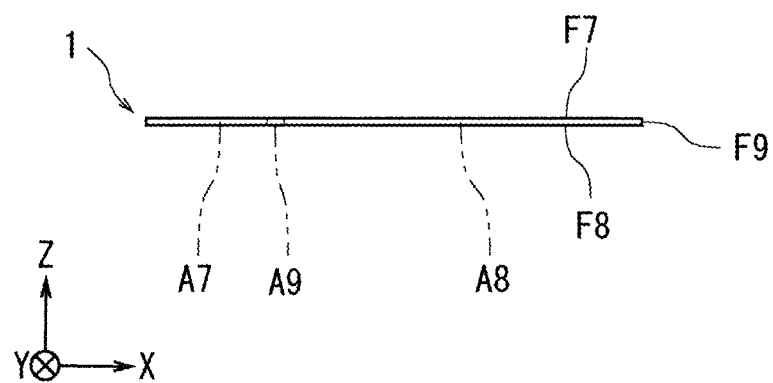
FIG. 15A illustrates a front view showing an example of a silicon substrate.
Figure 15B:
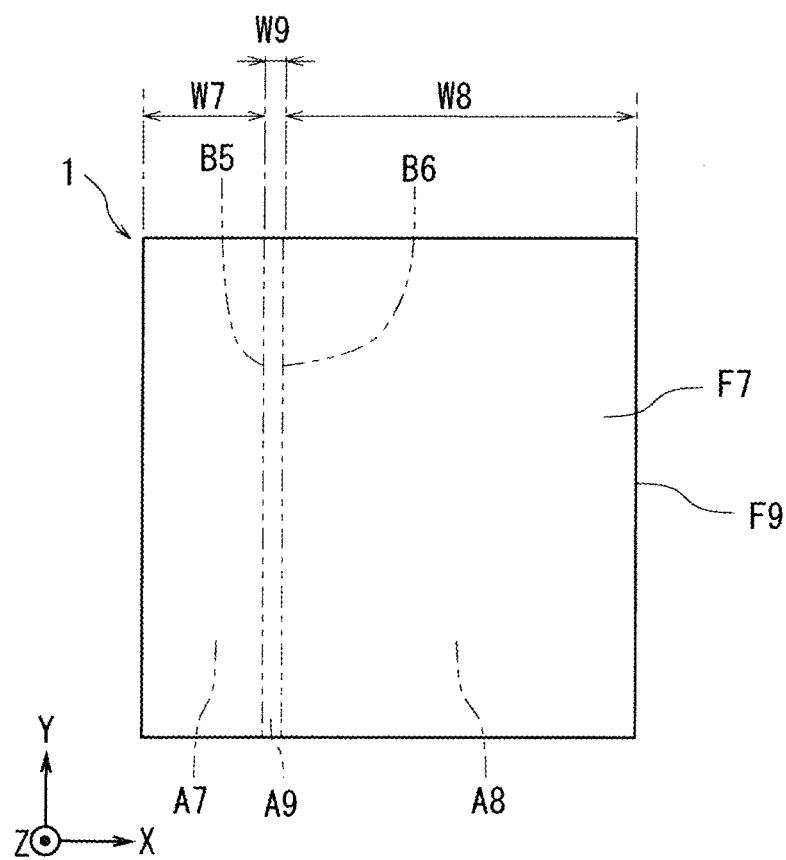
FIG. 15B is a plan view showing an example of the silicon substrate.

As shown in FIGS. 15A and 15B, the silicon substrate 1 is, for example, a flat plate-shaped substrate having a seventh surface F7, an eighth surface F8, and a ninth surface F9. In the examples in FIGS. 15A and 15B, the seventh surface F7 is a rectangular or square surface (also referred to as front surface) facing the +Z direction as the first direction. The eighth surface F8 is positioned on the back side of the seventh surface F7. In the examples in FIGS. 15A and 15B, the eighth surface F8 is a rectangular or square surface (also referred to as back surface) facing the −Z direction as the fourth direction opposite to the first direction. The ninth surface F9 is an outer peripheral surface positioned along the +Z direction as the first direction in a state of connecting the seventh surface F7 and the eighth surface F8. In the examples in FIGS. 15A and 15B, the ninth surface F9 is positioned in a state of connecting the front surface and the back surface along the +Z direction as the first direction, and is an outer peripheral surface along four sides of each of the seventh surface F7 and the eighth surface F8.

In addition, the silicon substrate 1 includes, for example, a fifth pseudo single crystal region A7, a sixth pseudo single crystal region A8, and a third intermediate region A9. The fifth pseudo single crystal region A7, the third intermediate region A9, and the sixth pseudo single crystal region A8 are positioned in a state of being adjacent in the order of this description in the +X direction as the second direction perpendicular to the +Z direction as the first direction.

The fifth pseudo single crystal region A7 is a region being constituted by pseudo single crystal. The fifth pseudo single crystal region A7 is, for example, a region formed by at least a part of the third pseudo single crystal region A4 of the silicon block Bk1. In the examples in FIGS. 15A and 15B, the fifth pseudo single crystal region A7 is a plate-shaped region having a rectangular front surface facing the +Z direction as the first direction and a rectangular back surface facing the −Z direction as the fourth direction.

The sixth pseudo single crystal region A8 is a region being constituted by pseudo single crystal. The sixth pseudo single crystal region A8 is, for example, a region formed by at least a part of the fourth pseudo single crystal region A5 of the silicon block Bk1. In the examples in FIGS. 15A and 15B, the sixth pseudo single crystal region A8 is a plate-shaped region having a rectangular upper surface facing the +Z direction as the first direction and a rectangular lower surface facing the −Z direction as the fourth direction.

The third intermediate region A9 includes one or more pseudo single crystal regions. The third intermediate region A9 is, for example, a region formed by at least a part of the second intermediate region A6 of the silicon block Bk1. In the examples in FIGS. 15A and 15B, the third intermediate region A9 is a plate-shaped region having an elongated rectangular upper surface facing the +Z direction as the first direction and an elongated rectangular lower surface facing the −Z direction as the fourth direction. In this case, for example, each shape of the boundary between the fifth pseudo single crystal region A7 and the third intermediate region A9 (also referred to as the fifth boundary) B5, and the boundary between the sixth pseudo single crystal region A8 and the third intermediate region A9 (also referred to as the sixth boundary) B6 is an elongated shape along the +Y direction as the third direction.

In addition, here, for example, in the +X direction as the second direction, each of the width of the fifth pseudo single crystal region A7 (also referred to as the seventh width) W7 and the width of the sixth pseudo single crystal region A8 (also referred to as the eighth width) W8 is larger than the width of the third intermediate region A9 (also referred to as the ninth width) W9. Here, for example, it is assumed that the seventh surface F7 and the eighth surface F8 of the silicon substrate 1 have a square shape having a side length of about 150 mm. In this case, for example, each of the seventh width W7 of the fifth pseudo single crystal region A7 and the eighth width W8 of the sixth pseudo single crystal region A8 are assumed to be about 50 mm to 100 mm, and the ninth width W9 of the third intermediate region A9 is assumed to be about 2 mm to 25 mm.

In addition, for example, each of the fifth boundary B5 between the fifth pseudo single crystal region A7 and the third intermediate region A9 and the sixth boundary B6 between the sixth pseudo single crystal region A8 and the third intermediate region A9 is positioned in a state of having a coincidence boundary. This coincidence boundary includes any one of, for example, a coincidence boundary with a Σ value of 5, a coincidence boundary with a Σ value of 13, a coincidence boundary with a Σ value of 17, a coincidence boundary with a Σ value of 25, and a coincidence boundary with a Σ value of 29. The silicon substrate 1 having such a configuration can be achieved by, for example, growing a pseudo single crystal from the seed crystal portion group 200s as a base point and forming a coincidence boundary above each of the boundary between the first seed crystal portion 201s and the intermediate seed crystal portion 203s and the boundary between the second seed crystal portion 202s and the intermediate seed crystal portion 203s. Then, when the coincidence boundary is formed, the silicon ingot In1 is less likely to be defective due to the relaxation of distortion, for example. Then, defects in the silicon substrate 1 obtained by slicing the silicon block Bk1 obtained by cutting off the outer peripheral portion of the silicon ingot In1 can also be reduced. Therefore, here, for example, if the above configuration of the silicon substrate 1 suitable for manufacturing the silicon substrate 1 whose defects can be reduced is adopted, the quality of the silicon substrate 1 can be improved by reducing the defects. Here, the existence of various coincidence boundaries and the abundance ratio of various coincidence boundaries at each of the fifth boundary B5 and the sixth boundary B6 can be checked using, for example, the EBSD method.

In addition, here, for example, the crystal orientation along the +Z direction as the first direction in each of one or more pseudo single crystal regions of the fifth pseudo single crystal region A7, the sixth pseudo single crystal region A8, and the third intermediate region A9 may be the <100> orientation in the Miller index. This configuration can be achieved by, for example, arranging the seed crystal portion group 200s on the bottom portion 121b of the mold 121 so that the plane orientation of the upper surface is (100) in the Miller index and inheriting the crystal orientation of the seed crystal portion group 200s to grow the silicon melt MS1 in one direction. In addition, in this case, for example, the crystal growth rate when unidirectional solidification of the silicon melt MS1 is to be performed can be improved. Thus, for example, the silicon ingot In1 including a first pseudo single crystal region A1, a first intermediate region A3, and a second pseudo single crystal region A2 formed by growing crystal grains upward starting from each of the first seed crystal portion 201s, the intermediate seed crystal portion 203s, and the second seed crystal portion 202s can be easily manufactured. Then, for example, the quality of the silicon substrate 1 can be easily improved by cutting out the silicon substrate 1 from the silicon ingot In1 through the silicon block Bk1.

Furthermore, here, for example, the coincidence boundary positioned at each of the fifth boundary B5 between the fifth pseudo single crystal region A7 and the third intermediate region A9 and the sixth boundary B6 between the sixth pseudo single crystal region A8 and the third intermediate region A9 may include a coincidence boundary with a Σ value of 29. Here, for example, a case of growing a pseudo single crystal from the seed crystal portion group 200s as a base point to manufacture a silicon ingot In1 is assumed. In this case, for example, while a random grain boundary with a Σ value of 29 is formed, at any time, above each of the boundary between the first seed crystal portion 201s and the intermediate seed crystal portion 203s and the boundary between the second seed crystal portion 202s and the intermediate seed crystal portion 203s, distortion is further relaxed at this random grain boundary, and defects are less likely to occur. Therefore, for example, if the above configuration of the silicon substrate 1 suitable for manufacturing the silicon ingot In1 in which defects are less likely to occur is adopted, the quality of the silicon substrate 1 can be further improved by reducing the defects.

In addition, here, for example, the seventh width W7 of the fifth pseudo single crystal region A7 and the eighth width W8 of the sixth pseudo single crystal region A8 may be the same or different.

1-6. Solar Cell Element

The silicon substrate 1 produced through the silicon block Bk1 by cutting out from the silicon ingot In1 according to the above-described one embodiment is used, for example, for a semiconductor substrate of the solar cell element 10 as a solar cell. An example of the configuration of the solar cell element 10 will be described with reference to FIGS. 16 to 18. The solar cell element 10 has a light receiving surface 10a on which light is incident and a non-light receiving surface 10b being a surface opposite to the light receiving surface 10a.

Figure 16:
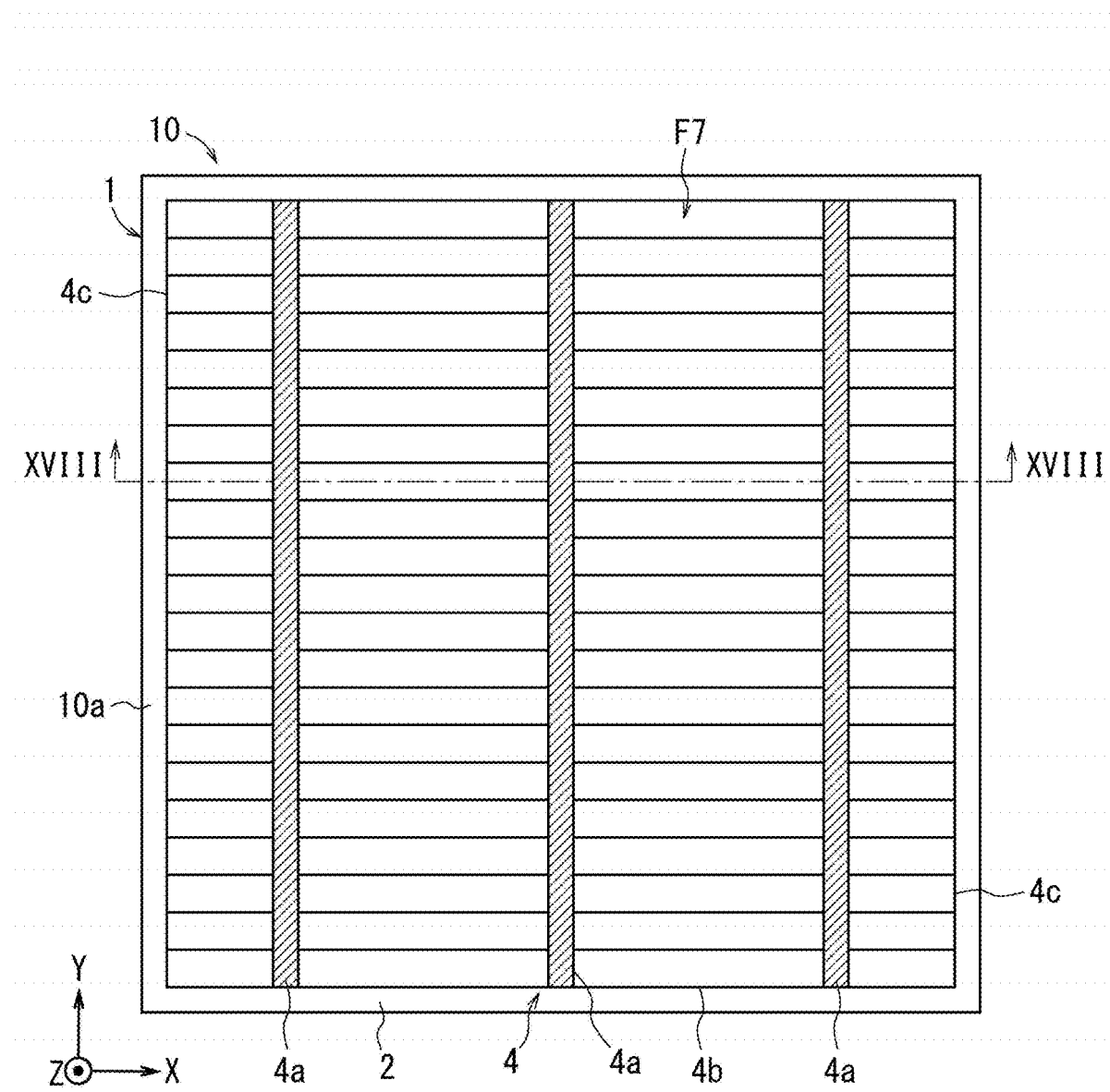
FIG. 16 illustrates a plan view showing an example of an appearance of a solar cell element on a light receiving surface side.
Figure 17:
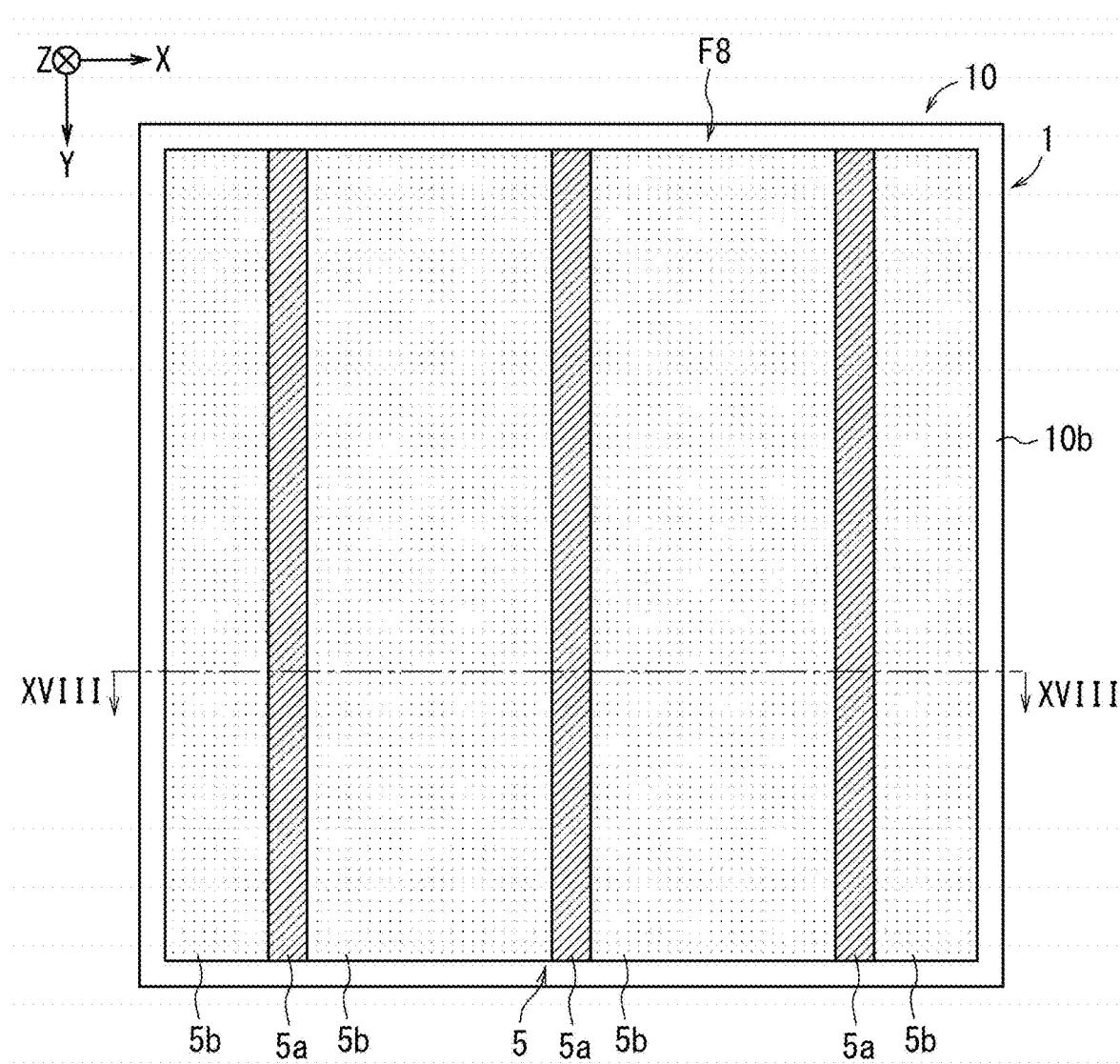
FIG. 17 illustrates a plan view showing an example of the appearance of the solar cell element on a non-light receiving surface side.
Figure 18:
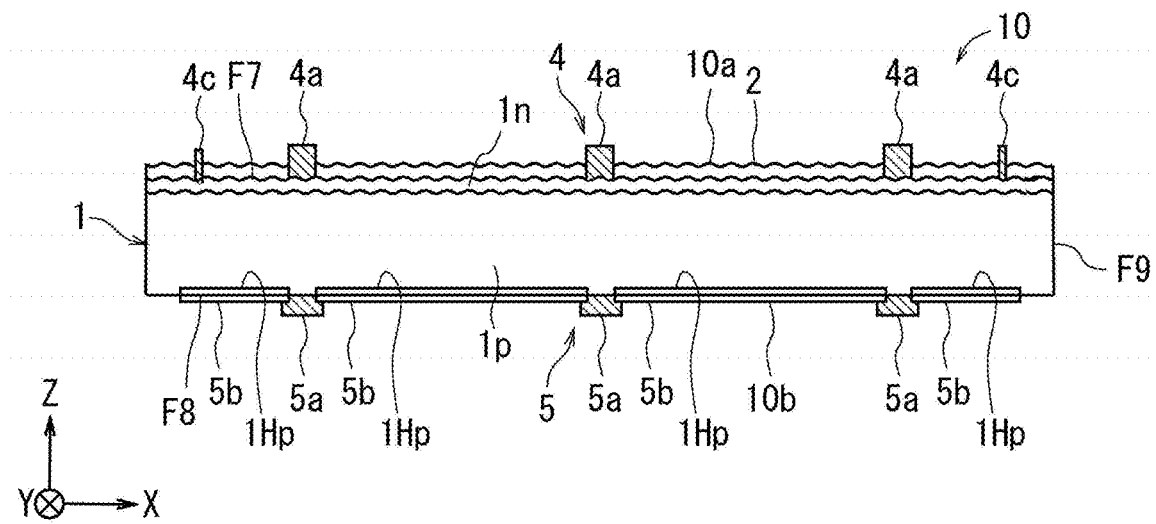
FIG. 18 illustrates a diagram showing an example of a virtual cutting plane portion of the solar cell element taken along lines XVIII-XVIII in FIGS. 16 and 17.

For example, as shown in FIGS. 16 to 18, the solar cell element 10 includes a silicon substrate 1, an antireflection film 2, a first electrode 4, and a second electrode 5.

The silicon substrate 1 has, for example, a first conductive type first semiconductor layer 1p and a second conductive type second semiconductor layer 1n positioned on the light receiving surface 10a side of the first semiconductor layer 1p. For example, if the first conductive type is p-type, the second conductive type is n-type. In addition, for example, if the first conductive type is n-type, the second conductive type is p-type. Here, for example, if the first conductive type is p-type, boron or the like is adopted as an element to be a dopant in order to make the conductive type of silicon ingot In1 p-type. Here, for example, if the concentration of boron in the silicon ingot In1 (the number of atoms per unit volume) is about from $1×10^{16}$ atoms/cubic centimeter (atoms/cm$^3$) to $1×10^{17}$ atoms/cm$^3$, the specific resistance of the silicon substrate 1 is about from 0.2 ohm centimeter (Ω·cm) to 2 Ω·cm. As a method for doping the silicon substrate 1 with boron, for example, a method of mixing a simple substance of an appropriate amount of elemental boron or an appropriate amount of silicon lumps with a known boron content concentration during manufacturing the silicon ingot In1 can be considered. In addition, here, for example, when the first conductive type is p-type, introducing impurities such as phosphorus into the surface layer portion on the seventh surface F7 side in the silicon substrate 1 by diffusion allows the second semiconductor layer 1n to be generated. Thus, the first semiconductor layer 1p and the second semiconductor layer 1n form a pn junction region.

In addition, the silicon substrate 1 may include a Back-Surface-Field (BSF) region 1Hp positioned on the eighth surface F8 side, for example. The BSF region 1Hp has a role of forming an internal electric field in the region on the eighth surface F8 side of the silicon substrate 1 and reducing recombination of minority carriers near the eighth surface F8. Thus, the photoelectric conversion efficiency of the solar cell element 10 is less likely to decrease. The BSF region 1Hp has the same conductive type as the first semiconductor layer 1p. The concentration of the majority carriers contained in the BSF region 1Hp is higher than the concentration of the majority carriers contained in the first semiconductor layer 1p. For example, when the silicon substrate 1 has a p-type, introducing an element serving as a dopant such as boron or aluminum into the surface layer portion on the eighth surface F8 side of the silicon substrate 1 by diffusion allows the BSF region 1Hp to be formed. Here, the concentration of the dopant in the BSF region 1Hp is, for example, about $1×10^{18}$ atoms/cm$^3$ to $5×10^{21}$ atoms/cm$^3$.

The antireflection film 2 is positioned, for example, on the seventh surface F7 on the light receiving surface 10a side of the silicon substrate 1. The antireflection film 2 plays a role of reducing the reflectance of the light receiving surface 10a for light in a desired wavelength range and facilitating the absorption of light in a desired wavelength range in the silicon substrate 1. This can increase the amount of carriers generated by the photoelectric conversion on the silicon substrate 1. As the material of the antireflection film 2, for example, one or more materials among silicon nitride, titanium oxide, silicon oxide, and the like are applied. Here, for example, if the thickness of the antireflection film 2 is appropriately set according to the material of the antireflection film 2, a condition in which incident light in a desired wavelength range is hardly reflected (also referred to as a non-reflection condition) can be achieved. Specifically, for example, the refractive index of the antireflection film 2 is about 1.8 to 2.3, and the thickness of the antireflection film 2 is about 50 nanometers (nm) to 120 nm.

The first electrode 4 is positioned, for example, on the seventh surface F7 on the light receiving surface 10a side of the silicon substrate 1. As shown in FIGS. 16 and 18, the first electrode 4 includes, for example, a first output extraction electrode 4a and a plurality of linear first collecting electrodes 4b. In the examples in FIGS. 16 and 18, the first electrode 4 includes three first output extraction electrodes 4a having a longitudinal direction along the +Y direction, and 22 linear first collecting electrodes 4b having a longitudinal direction along the +X direction. At least a part of each first output extraction electrode 4a is in a state of intersecting with each first collecting electrode 4b. The line width of the first output extraction electrode 4a is, for example, about 0.6 mm to 1.5 mm. The line width of the first collecting electrode 4b is, for example, about 25 µm to 100 µm. Therefore, the line width of the first collecting electrode 4b is smaller than the line width of the first output extraction electrode 4a. The plurality of linear first collecting electrodes 4b are positioned in the +Y direction at predetermined intervals in a state of being substantially parallel to each other. The predetermined interval is, for example, about 1.5 mm to 3 mm. The thickness of the first electrode 4 is, for example, about 10 µm to 40 µm. The first electrode 4 may include, for example, auxiliary electrodes 4c positioned so as to connect the end portions in the +X direction of the plurality of first collecting electrodes 4b and auxiliary electrodes 4c positioned so as to connect the end portions in the −X direction of the plurality of first collecting electrodes 4b. The line width of the auxiliary electrode 4c is, for example, substantially the same as the line width of the first collecting electrode 4b. The first electrode 4 can be formed, for example, by applying a silver paste on the seventh surface F7 side of the silicon substrate 1 in a desired pattern and then baking the silver paste. The silver paste can be produced, for example, by mixing a powder mainly containing silver, a glass frit, an organic vehicle, and the like. The main component means the component having the highest content rate among the contained components. As the method of applying the silver paste, a screen printing method or the like is applied, for example.

The second electrode 5 is positioned, for example, on the eighth surface F8 on the non-light receiving surface 10b side of the silicon substrate 1. As shown in FIGS. 17 and 18, the second electrode 5 includes, for example, a second output extraction electrode 5a and a second collecting electrode 5b. In the examples in FIGS. 17 and 18, the second electrode 5 includes three second output extraction electrodes 5a having a longitudinal direction along the +Y direction. The thickness of the second output extraction electrode 5a is, for example, about 10 μm to 30 μm. The line width of the second output extraction electrode 5a is, for example, about 1 mm to 4 mm. The second output extraction electrode 5a can be formed by, for example, the same material and manufacturing method as the first electrode 4. The second output extraction electrode 5a can be formed, for example, by applying a silver paste on the eighth surface F8 side of the silicon substrate 1 in a desired pattern and then baking the silver paste. The second collecting electrode 5b is positioned on the eighth surface F8 side of the silicon substrate 1 over substantially the entire surface except for most of the region where the second output extraction electrodes 5a are formed. The thickness of the second collecting electrode 5b is, for example, about 15 μm to 50 μm. The second collecting electrode 5b can be formed, for example, by applying an aluminum paste on the eighth surface F8 side of the silicon substrate 1 in a desired pattern and then baking the aluminum paste. The aluminum paste can be produced, for example, by mixing a powder mainly containing aluminum, glass frits, organic vehicles, and the like. As the method of applying the aluminum paste, a screen printing method or the like is applied, for example.

Here, as described above, the silicon substrate 1 includes, for example, in the +X direction as the second direction, a fifth pseudo single crystal region A7, a third intermediate region A9 including one or more pseudo single crystal regions, and a sixth pseudo single crystal region A8. Thus, for example, with respect to this silicon substrate 1, a plurality of linear first collecting electrodes 4b may be positioned side by side substantially parallel to each other at predetermined intervals in the +Y direction as the third direction orthogonal to the +X direction as the second direction. In other words, for example, the first collecting electrode 4b may be positioned from the area on the fifth pseudo single crystal region A7 through the third intermediate region A9 onto the sixth pseudo single crystal region A8. Thus, for example, when the carriers generated in the silicon substrate 1 are collected by the first collecting electrode 4b, the probability of each carrier passing through the fifth boundary B5 between the fifth pseudo single crystal region A7 and the third intermediate region A9 and the sixth boundary B6 between the sixth pseudo single crystal region A8 and the third intermediate region A9 is reduced. As a result, the power generation efficiency of the solar cell element 10 can be increased.

In addition, for example, with respect to the silicon substrate 1, a plurality of linear first collecting electrodes 4b may be positioned side by side substantially parallel to each other at predetermined intervals in the +X direction as the second direction. In this case, the first collecting electrode 4b is substantially parallel to each of the fifth boundary B5 between the fifth pseudo single crystal region A7 and the third intermediate region A9 and the sixth boundary B6 between the sixth pseudo single crystal region A8 and the third intermediate region A9. Thus, the fifth boundary B5 and the sixth boundary B6 are inconspicuous due to the presence of the plurality of linear first collecting electrodes 4b. As a result, the design properties of the solar cell element 10 can be enhanced. Therefore, for example, when aesthetic appearance is required rather than power generation efficiency, the solar cell element 10 having the above structure can be adopted. In addition, here, for example, if the first collecting electrode 4b is positioned on at least one of the fifth boundary B5 and the sixth boundary B6, the design properties of the solar cell element 10 can be further enhanced.

1-7. Summary of One Embodiment

For example, in the method for manufacturing a silicon ingot In1 according to one embodiment, the intermediate seed crystal portion 203s is arranged between the first seed crystal portion 201s and the second seed crystal portion 202s on the bottom portion 121b of the mold 121. At this time, the first seed crystal portion 201s and the intermediate seed crystal portion 203s are arranged so that, between the first seed crystal portion 201s and the intermediate seed crystal portion 203s, the first rotation angle relationship of single crystal silicon in the rotation direction about the virtual axis along the +Z direction as the first direction is a rotation angle relationship of single crystal silicon corresponding to the coincidence boundary. In addition, the intermediate seed crystal portion 203s and the second seed crystal portion 202s are arranged so that, also between the intermediate seed crystal portion 203s and the second seed crystal portion 202s, the second rotation angle relationship of single crystal silicon about the virtual axis along the +Z direction as the first direction is a rotation angle relationship of single crystal silicon corresponding to the coincidence boundary. Thus, for example, when a pseudo single crystal is grown by unidirectional solidification of the silicon melt MS1 starting from each of the first seed crystal portion 201s, the intermediate seed crystal portion 203s, and the second seed crystal portion 202s as a base point, coincidence boundaries as functional grain boundaries can be formed above the boundary between the first seed crystal portion 201s and the intermediate seed crystal portion 203s, and above the boundary between the intermediate seed crystal portion 203s and the second seed crystal portion 202s. Therefore, for example, when the unidirectional solidification of the silicon melt MS1 progresses, the distortion can be relaxed while the coincidence boundaries are formed at any time. In addition, for example, when the unidirectional solidification of the silicon melt MS1 progresses, dislocations are relatively likely to occur above the region between the first seed crystal portion 201s and the second seed crystal portion 202s, but dislocations are likely to disappear when the two functional grain boundaries are formed, and dislocations are likely to be confined in the pseudo single crystal region sandwiched between the two functional grain boundaries. This can improve the quality of the silicon ingot In1, for example by reducing defects.

In addition, for example, the silicon ingot In1 according to one embodiment includes a first intermediate region A3 including one or more pseudo single crystal regions between the first pseudo single crystal region A1 and the second pseudo single crystal region A2 in the +X direction as the second direction. Then, each of the first boundary B1 between the first pseudo single crystal region A1 and the first intermediate region A3 and the second boundary B2 between the second pseudo single crystal region A2 and the first intermediate region A3 includes a coincidence boundary. The silicon ingot In1 having such a configuration can be achieved by, for example, growing a pseudo single crystal from the seed crystal portion group 200s as a base point and forming a coincidence boundary above each of the boundary between the first seed crystal portion 201s and the intermediate seed crystal portion 203s and the boundary between the second seed crystal portion 202s and the intermediate seed crystal portion 203s. Then, when the coincidence boundary is formed, the silicon ingot In1 is less likely to be defective due to the relaxation of distortion, for example. Therefore, here, for example, adopting the configuration of the silicon ingot In1 suitable for manufacturing the silicon ingot In1 in which defects are less likely to occur allows the quality of the silicon ingot In1 to be improved by reducing the defects.

In addition, for example, the silicon block Bk1 according to one embodiment can be produced by cutting out from the silicon ingot In1 according to one embodiment. The silicon block Bk1 includes a second intermediate region A6 including one or more pseudo single crystal regions between the third pseudo single crystal region A4 and the fourth pseudo single crystal region A5 in the +X direction as the second direction, for example. Then, each of the third boundary B3 between the third pseudo single crystal region A4 and the second intermediate region A6 and the fourth boundary B4 between the fourth pseudo single crystal region A5 and the second intermediate region A6 includes a coincidence boundary. Here, for example, adopting the configuration of the silicon block Bk1 suitable for manufacturing the silicon ingot In1 in which defects are less likely to occur allows the quality of the silicon block Bk1 to be improved by reducing the defects.

In addition, for example, the silicon substrate 1 according to one embodiment can be obtained by cutting out from the silicon ingot In1 according to one embodiment. The silicon substrate 1 includes a third intermediate region A9 including one or more pseudo single crystal regions between the fifth pseudo single crystal region A7 and the sixth pseudo single crystal region A8 in the +X direction as the second direction, for example. Then, each of the fifth boundary B5 between the fifth pseudo single crystal region A7 and the third intermediate region A9 and the sixth boundary B6 between the sixth pseudo single crystal region A8 and the third intermediate region A9 includes a coincidence boundary. Here, for example, adopting the configuration of the silicon substrate 1 suitable for manufacturing the silicon ingot In1 in which defects are less likely to occur allows the quality of the silicon substrate 1 to be improved by reducing the defects.

2. Others

The present disclosure is not limited to the above-described one embodiment, and various changes and improvements can be made in a scope without departing from the gist of the present disclosure.

In the above one embodiment, for example, each of the first surface F1 and the second surface F2 of the silicon ingot In1 and the fourth surface F4 and the fifth surface F5 of the silicon block Bk1 is not limited to have a rectangular shape, and may have various shapes corresponding to the shape or the like of the silicon substrate 1.

Needless to say, all or part of components constituting each of the above one embodiment and its various modifications can be combined in an appropriate and consistent scope.

The invention claimed is:

1. A silicon ingot including a first surface, a second surface positioned on an opposite side of the first surface, and a third surface positioned along a first direction in a state of connecting the first surface and the second surface, the silicon ingot comprising:
   a first pseudo single crystal region;
   a first intermediate region containing one or more pseudo single crystal regions; and
   a second pseudo single crystal region, wherein
   the first pseudo single crystal region, the first intermediate region, and the second pseudo single crystal region are positioned adjacent sequentially in a second direction perpendicular to the first direction,
   in the second direction, each of a first width of the first pseudo single crystal region and a second width of the second pseudo single crystal region is larger than a third width of the first intermediate region,
   each of a boundary between the first pseudo single crystal region and the first intermediate region and a boundary between the second pseudo single crystal region and the first intermediate region includes a coincidence boundary, and
   a crystal orientation along the first direction in each of the first pseudo single crystal region, the second pseudo single crystal region, and the one or more pseudo single crystal regions is a <100> orientation in a Miller index.

2. The silicon ingot according to claim 1, wherein the coincidence boundary includes a coincidence boundary having a $\Sigma$ value of 29.

3. The silicon ingot according to claim 1, wherein the first width and the second width are different.

4. A silicon block including a first surface, a second surface positioned on an opposite side of the first surface, and a third surface positioned along a first direction in a state of connecting the first surface and the second surface, the silicon block comprising:
   a first pseudo single crystal region;
   a first intermediate region containing one or more pseudo single crystal regions; and
   a second pseudo single crystal region, wherein
   the first pseudo single crystal region, the first intermediate region, and the second pseudo single crystal region are positioned adjacent sequentially in a second direction perpendicular to the first direction,
   in the second direction, each of a first width of the first pseudo single crystal region and a second width of the second pseudo single crystal region is larger than a third width of the first intermediate region,
   each of a boundary between the first third pseudo single crystal region and the first intermediate region and a boundary between the second pseudo single crystal region and the first intermediate region includes a coincidence boundary, and
   a crystal orientation along the first direction in each of the first pseudo single crystal region, the second pseudo single crystal region, and the one or more pseudo single crystal regions is a <100> orientation in a Miller index.

5. The silicon block according to claim 4, wherein the coincidence boundary includes a coincidence boundary having a $\Sigma$ value of 29.

6. The silicon block according to claim 4, wherein the first width and the second width are different.

7. A silicon substrate with a flat plate shape including a first surface, a second surface positioned on a back side of the first surface in a first direction, and an outer peripheral surface positioned in a state of connecting the first surface and the second surface, the silicon substrate comprising:
   a first pseudo single crystal region;
   a first intermediate region containing one or more pseudo single crystal regions; and
   a second pseudo single crystal region, wherein
   the first pseudo single crystal region, the first intermediate region, and the second pseudo single crystal region are positioned adjacent sequentially in a second direction perpendicular to the first direction, in the second direction, each of a first width of the first pseudo single crystal region and a second width of the second pseudo single crystal region is larger than a third width of the first intermediate region, each of a boundary between the first pseudo single crystal region and the first intermediate region and a boundary between the second pseudo single crystal region and the first intermediate region includes a coincidence boundary, and a crystal orientation along the first direction in each of the first pseudo single crystal region, the second pseudo single crystal region, and the one or more pseudo single crystal regions is a <100> orientation in a Miller index.

8. The silicon substrate according to claim 7, wherein the coincidence boundary includes a coincidence boundary having a Σ value of 29.

9. A method for manufacturing a silicon ingot, the method comprising:
- a first step of preparing a mold having an opening that opens in a first direction;
- a second step of arranging a first seed crystal portion of single crystal silicon, an intermediate seed crystal portion including one or more pieces of single crystal silicon and having a width in a second direction perpendicular to the first direction smaller than that of the first seed crystal portion, and a second seed crystal portion of single crystal silicon having a width in the second direction larger than that of the intermediate seed crystal portion so that the first seed crystal portion, the intermediate seed crystal portion, and the second seed crystal portion are adjacent sequentially in the second direction on a bottom surface portion in the mold;
- a third step of pouring silicon melt into the mold in a state where a temperature of the first seed crystal portion, the intermediate seed crystal portion, and the second seed crystal portion are raised to near a melting point of silicon; and
- a fourth step of causing the silicon melt to perform unidirectional solidification upward from the bottom surface portion side of the mold, wherein the second step includes arranging the first seed crystal portion, the intermediate seed crystal portion, and the second seed crystal portion so that each of a first rotation angle relationship about a virtual axis along the first direction of single crystal silicon between the first seed crystal portion and the intermediate seed crystal portion and a second rotation angle relationship about a virtual axis along the first direction of single crystal silicon between the second seed crystal portion and the intermediate seed crystal portion is a rotation angle relationship of single crystal silicon corresponding to a coincidence boundary, and the second step includes arranging the first seed crystal portion, the intermediate seed crystal portion, and the second seed crystal portion so that an upper surface of a silicon crystal having a plane orientation in a Miller index of (100) is positioned in a state of facing the first direction.

10. The method according to claim 9, wherein the second step includes arranging the first seed crystal portion, the intermediate seed crystal portion, and the second seed crystal portion so that the first rotation angle relationship and the second rotation angle relationship are a rotation angle relationship of single crystal silicon corresponding to a coincidence boundary with a Σ value of 29 with a virtual axis along a <100> orientation in a Miller index as a rotation axis.

11. The method according to claim 9, wherein the second step includes making a first width of the first seed crystal portion and a second width of the second seed crystal portion in the second direction different.

12. A solar cell, comprising:

the silicon substrate according to claim 7; and an electrode positioned on the silicon substrate.

\* \* \* \* \*